(12) United States Patent
Hwu et al.

(10) Patent No.: US 12,464,776 B2
(45) Date of Patent: Nov. 4, 2025

(54) CHARGE-COUPLED TRANSISTOR WITH DIFFERENT-DIELECTRIC-THICKNESS STRUCTURE

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Jenn-Gwo Hwu, Taipei (TW); Tzu-Hao Chiang, New Taipei (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 324 days.

(21) Appl. No.: 17/459,924

(22) Filed: Aug. 27, 2021

(65) Prior Publication Data
US 2023/0067672 A1 Mar. 2, 2023

(51) Int. Cl.
H10D 30/67 (2025.01)
H10D 30/01 (2025.01)

(52) U.S. Cl.
CPC ....... H10D 30/6755 (2025.01); H10D 30/031 (2025.01); H10D 30/6713 (2025.01); H10D 30/6757 (2025.01)

(58) Field of Classification Search
CPC .......... H01L 29/7869; H01L 29/66742; H01L 29/78618; H01L 29/78696; H10D 30/6755; H10D 30/6757; H10D 30/6713; H10D 30/031
See application file for complete search history.

(56) References Cited

U.S. PATENT DOCUMENTS

| | | | |
|---|---|---|---|
| 6,509,253 B1* | 1/2003 | Yu | H01L 21/28114 257/E21.205 |
| 9,735,197 B1* | 8/2017 | Kwag | H01L 27/14643 |
| 10,446,689 B1* | 10/2019 | Huang | H01L 29/41733 |
| 2014/0084343 A1* | 3/2014 | Dewey | H01L 29/513 977/734 |

(Continued)

OTHER PUBLICATIONS

Chang-Feng Yang et al., "Gate Oxide Local Thinning Mechanism-Induced Sub-60 mV/Decade Subthreshold Swing on Charge-Coupled MIS(p) Tunnel Transistor", IEEE Transactions on Electron Devices, vol. 66, No. 1, Jan. 2019, pp. 279-285.

*Primary Examiner* — Norman D Richards
*Assistant Examiner* — Sean Ayers Winters
(74) *Attorney, Agent, or Firm* — Maschoff Brennan

(57) ABSTRACT

A device includes a substrate, a dielectric structure, a gate electrode, and a drain electrode. The dielectric structure is over the substrate. The dielectric structure includes a first portion, a second portion, and a third portion. The first portion has a first equivalent oxide thickness. The second portion is spaced apart from the first portion and has a second equivalent oxide thickness. The third portion laterally surrounds the first and second portions and has a third equivalent oxide thickness greater than the first equivalent oxide thickness of the first portion. The gate electrode is over the dielectric structure and in contact with the first and third portions of the dielectric structure. The drain electrode is over the dielectric structure and in contact with the second and third portions of the dielectric structure.

20 Claims, 26 Drawing Sheets

(56) References Cited

U.S. PATENT DOCUMENTS

| | | | | |
|---|---|---|---|---|
| 2016/0111501 A1* | 4/2016 | Chen | ................... | H01L 23/3171 |
| | | | | 257/192 |
| 2016/0149020 A1* | 5/2016 | Basu | ................... | H01L 29/1037 |
| | | | | 438/268 |
| 2016/0149054 A1* | 5/2016 | Basu | ................. | H01L 29/78696 |
| | | | | 438/284 |
| 2017/0358685 A1* | 12/2017 | Sasagawa | .............. | H10B 41/70 |
| 2019/0131461 A1* | 5/2019 | Chen | ................ | H01L 29/78696 |
| 2019/0157403 A1* | 5/2019 | Yasuda | ............. | H01L 23/49844 |

\* cited by examiner

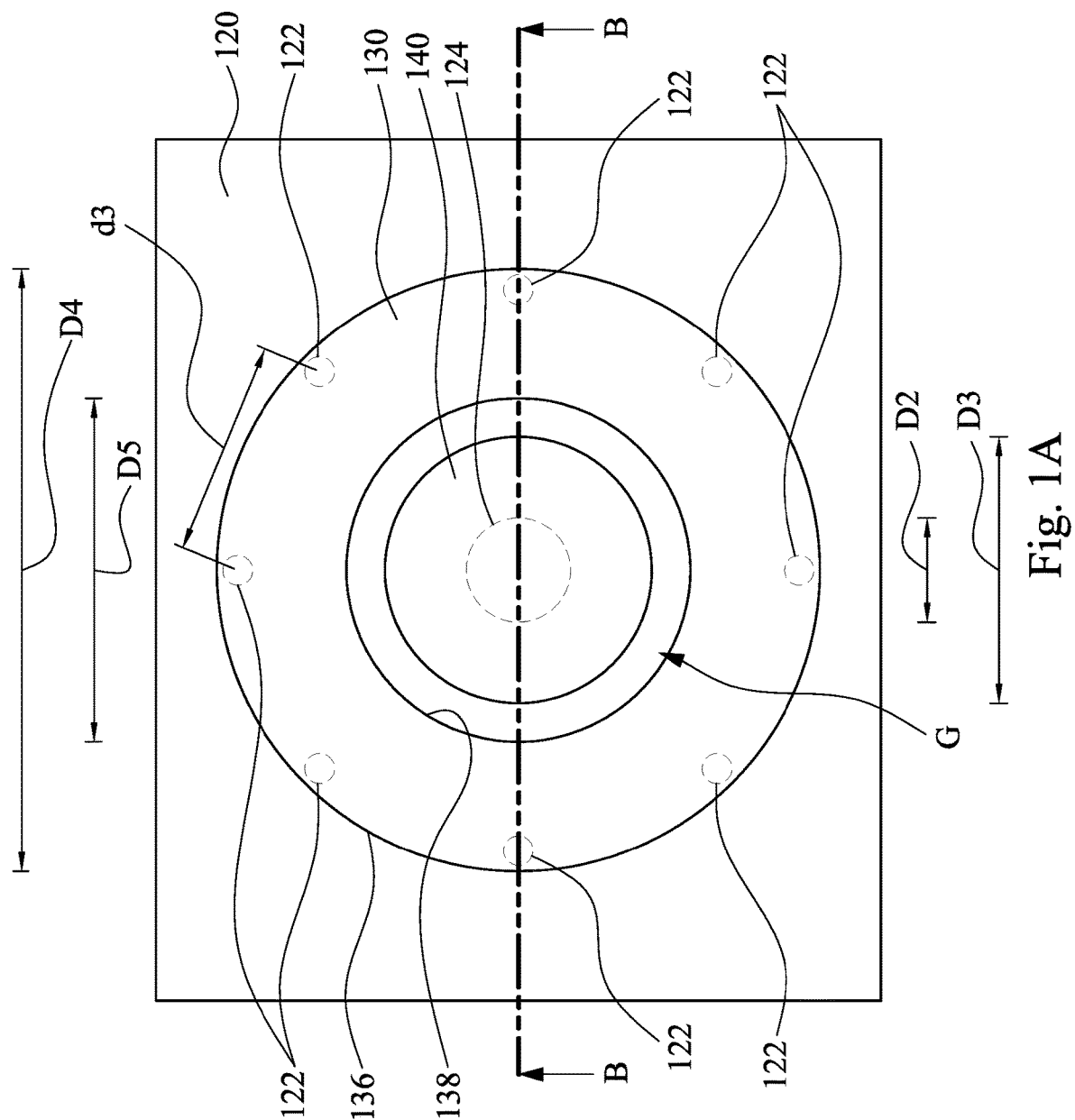

M10

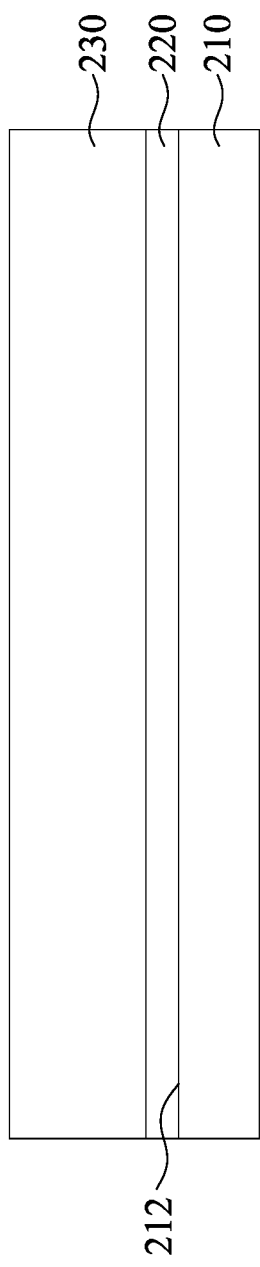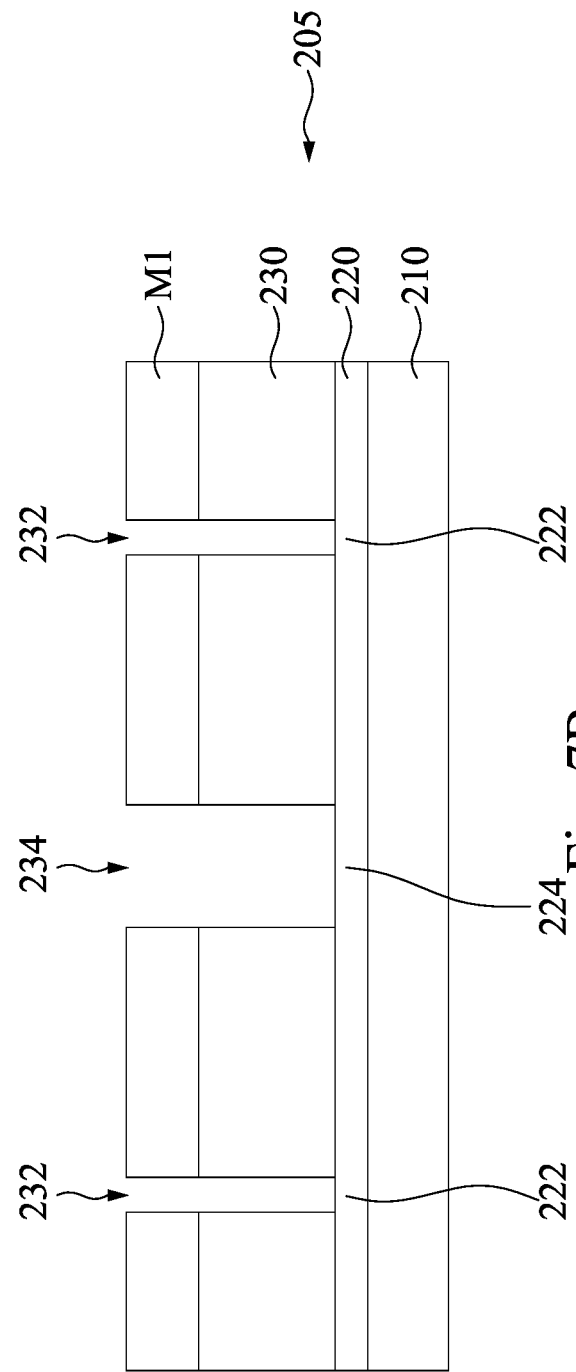

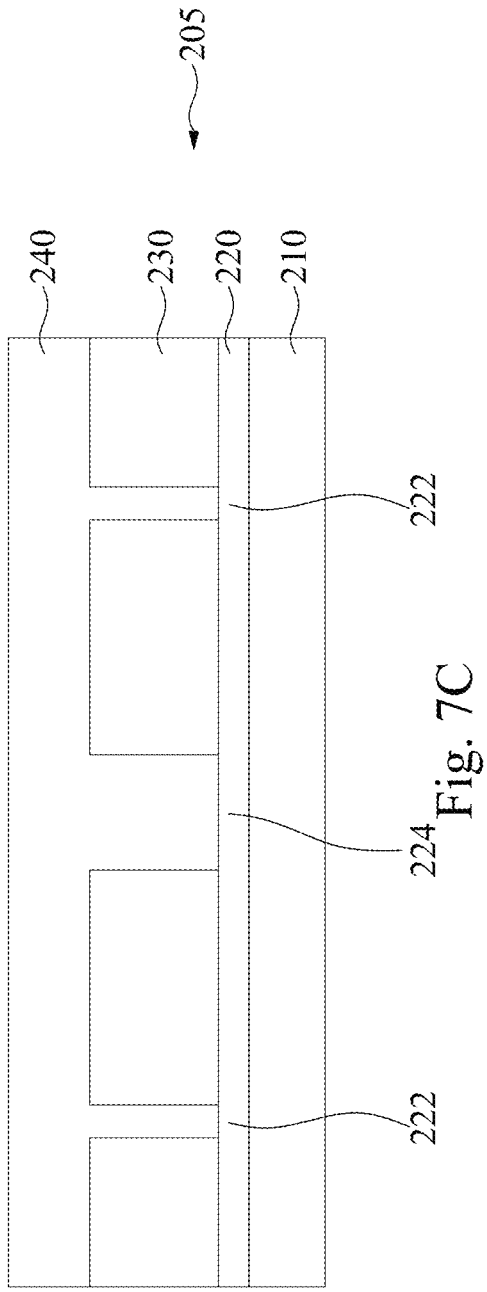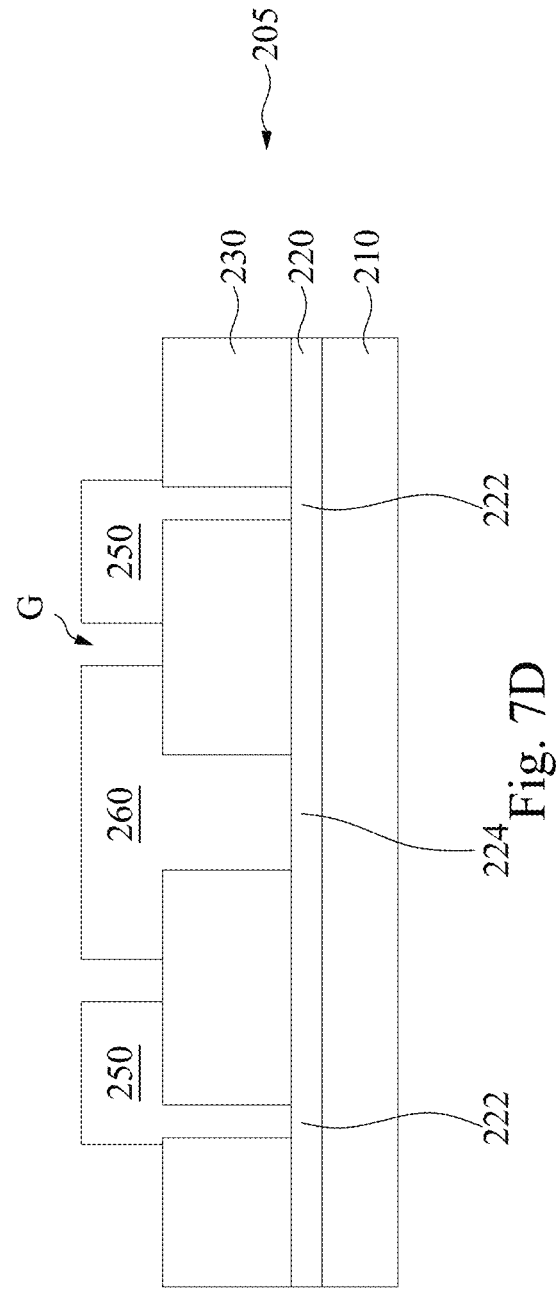

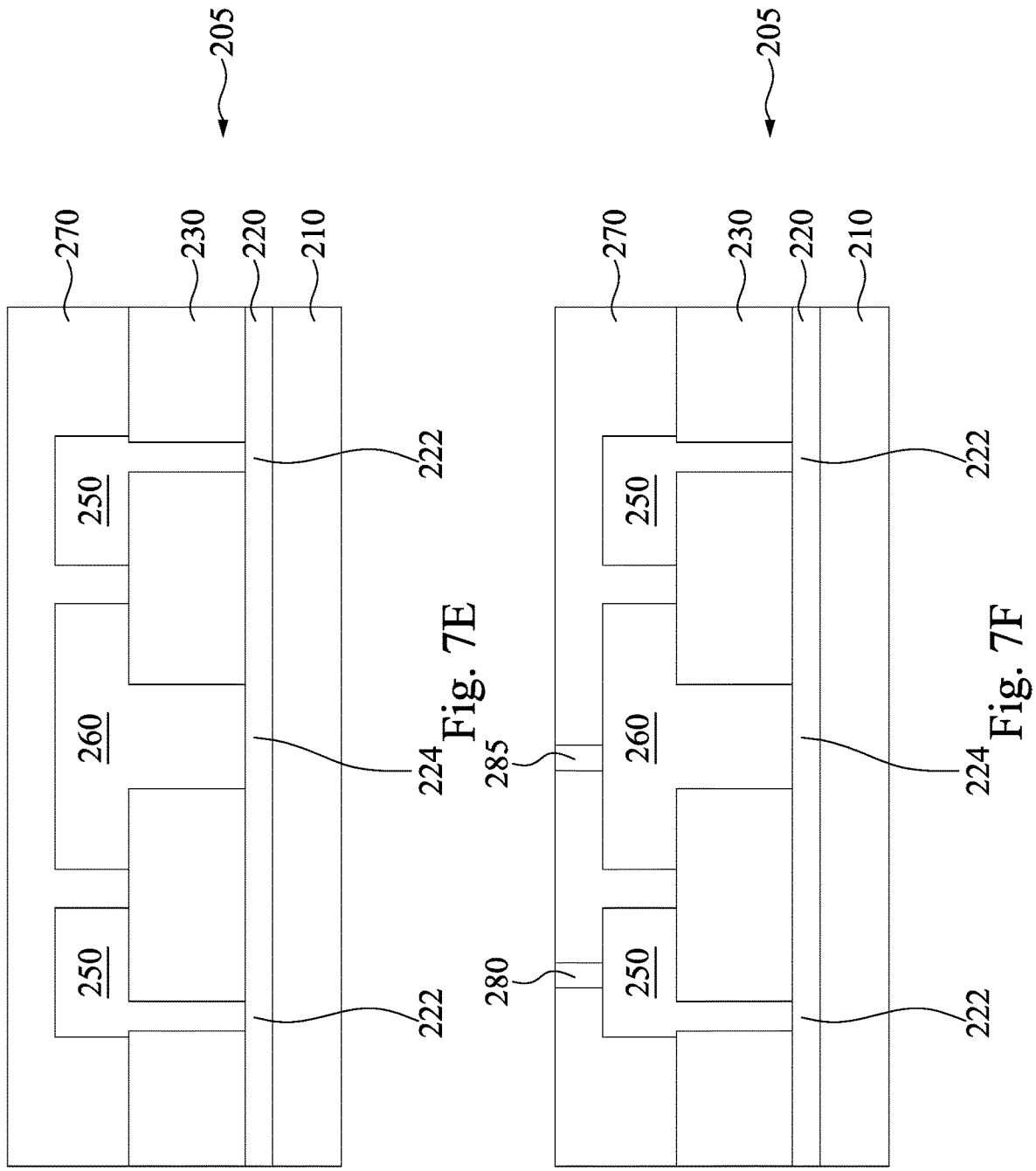

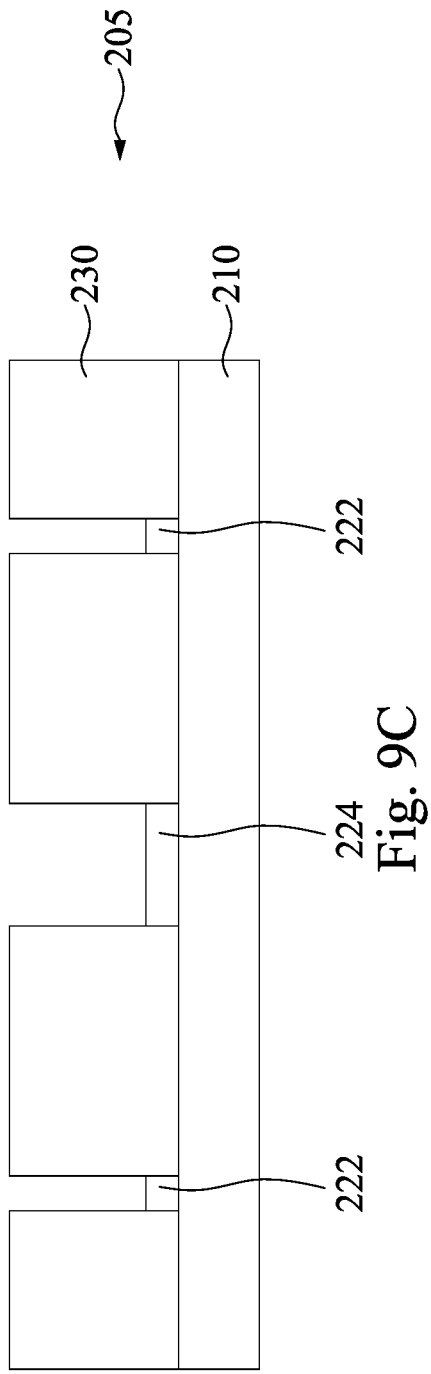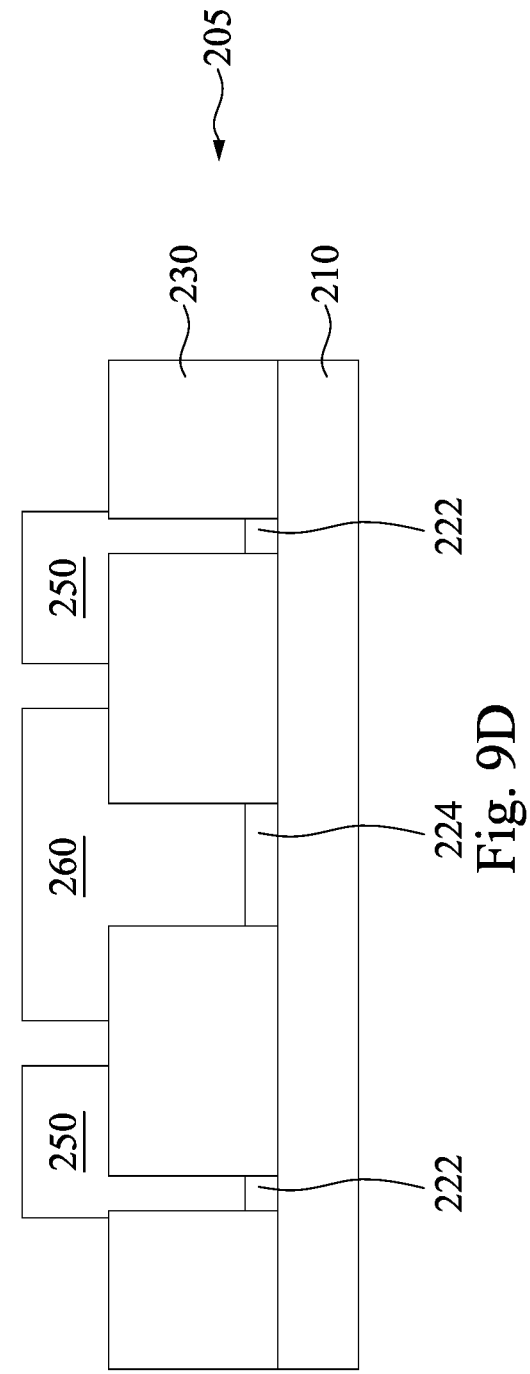

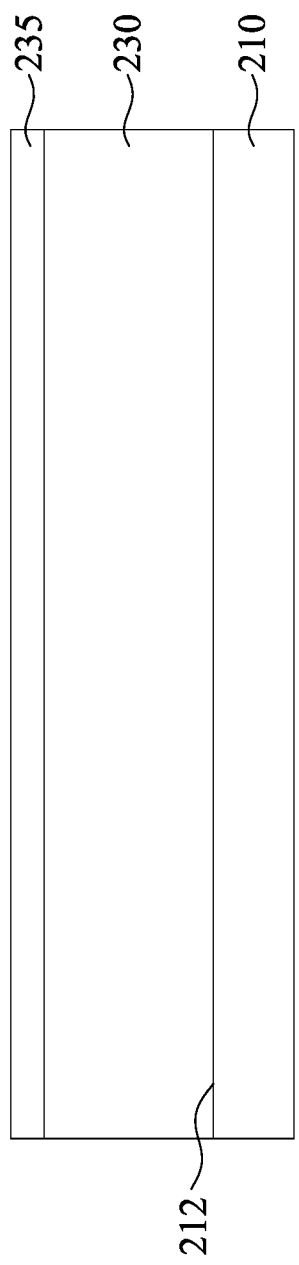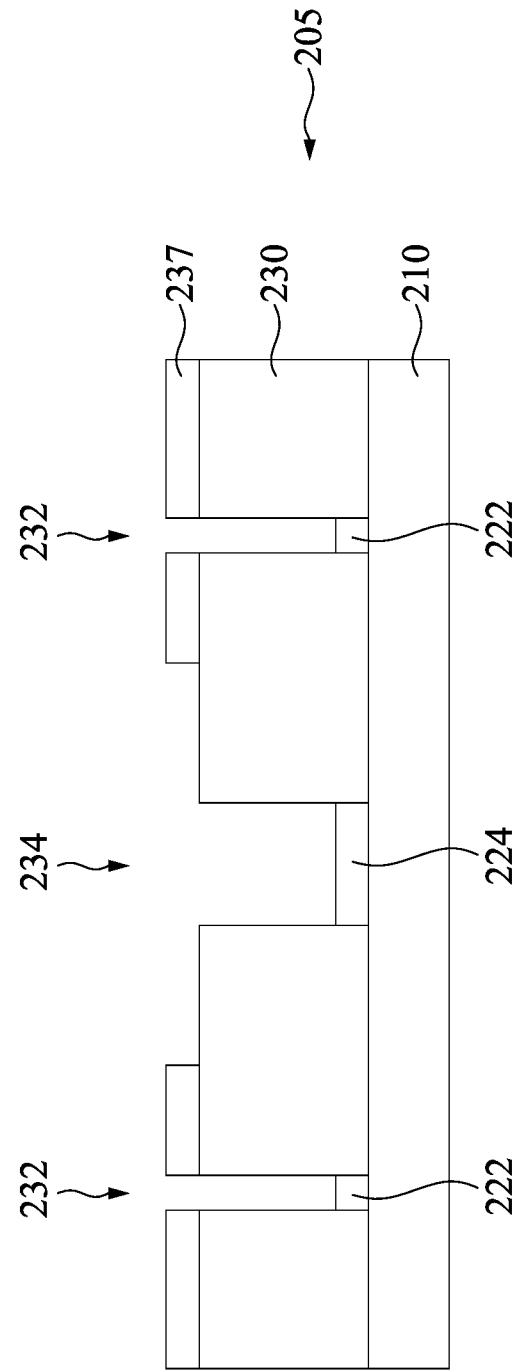

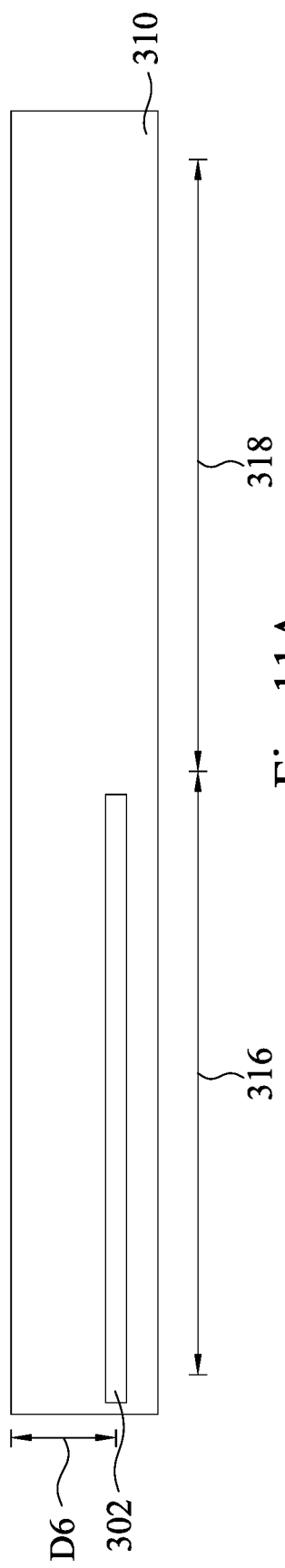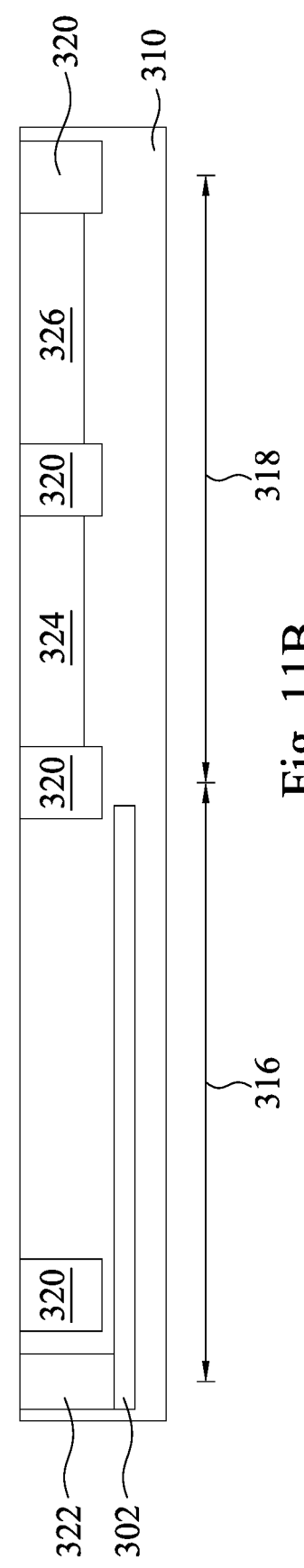

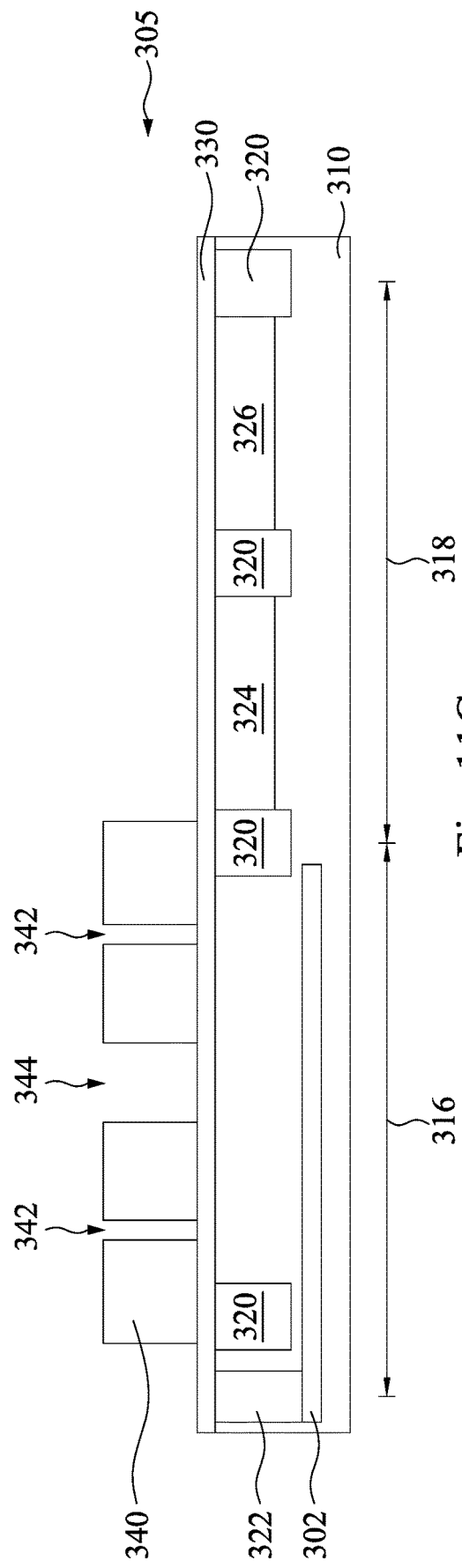
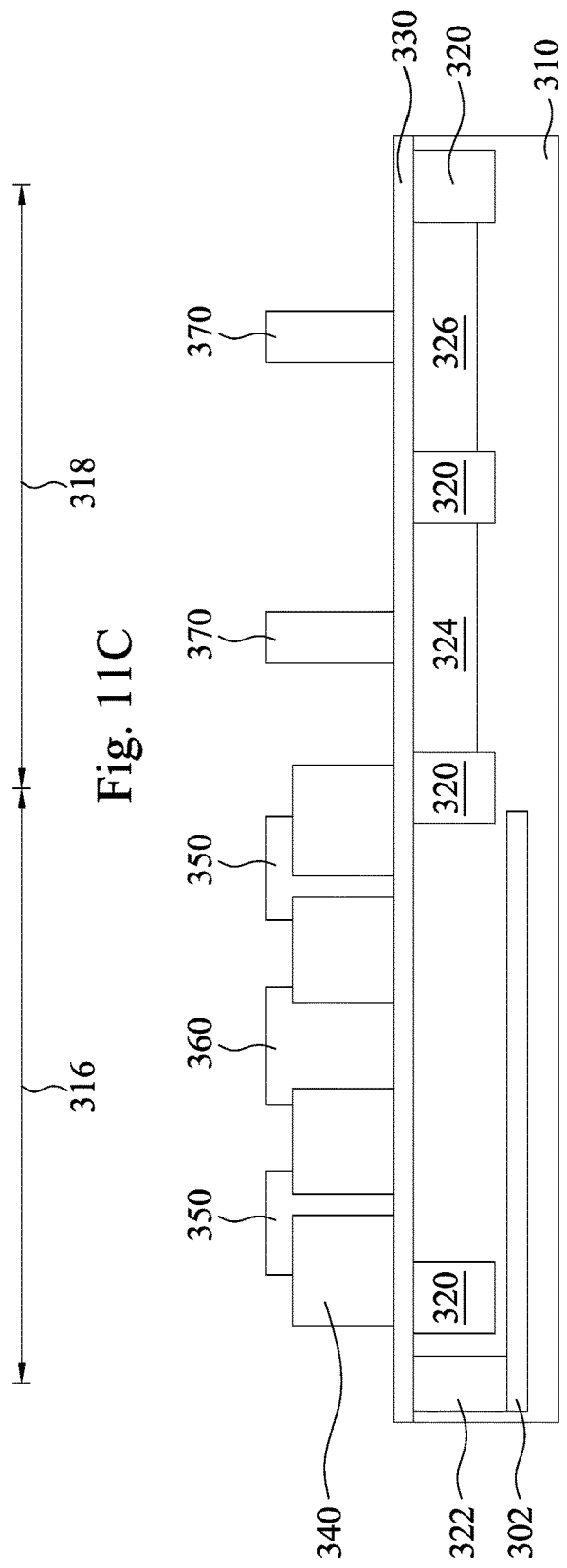
Fig. 11C
Fig. 11D

CHARGE-COUPLED TRANSISTOR WITH DIFFERENT-DIELECTRIC-THICKNESS STRUCTURE

BACKGROUND

Semiconductor devices are used in a large number of electronic devices, such as computers, cell phones, and others. Semiconductor devices may include integrated circuits that are formed on semiconductor wafers by depositing many types of thin films of material over the semiconductor wafers, and patterning the thin films of material to form the integrated circuits.

A semiconductor device (e.g., a transistor) can work in three regions including a linear region, a saturation region, and a sub-threshold region, depending on the gate voltage Vg and the source-drain voltage Vds. The sub-threshold region is a region in which gate voltage Vg is lower than the threshold voltage Vt. A parameter known as Sub-threshold Swing (SS) represents the easiness of switching the transistor current off and on, and is a factor in determining the speed of a semiconductor device. The sub-threshold swing can be expressed as a function of $m*kT/q$, where m is a parameter related to capacitance, k is the Boltzman constant, T is the absolute temperature, and q is the magnitude of the electrical charge on an electron.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a top view of a semiconductor device, in accordance with some embodiments.

FIGS. 7A-7G illustrate the method for manufacturing a semiconductor device in different stages in accordance with some embodiments.

FIGS. 9A-9E illustrate the method for manufacturing a semiconductor device in different stages in accordance with some embodiments.

FIGS. 10A-10C illustrate the method for manufacturing a semiconductor device in different stages in accordance with some embodiments.

FIG. 11A-11G illustrate the method for manufacturing a semiconductor device in different stages in accordance with some embodiments.

DETAILED DESCRIPTION

Figure 1B:
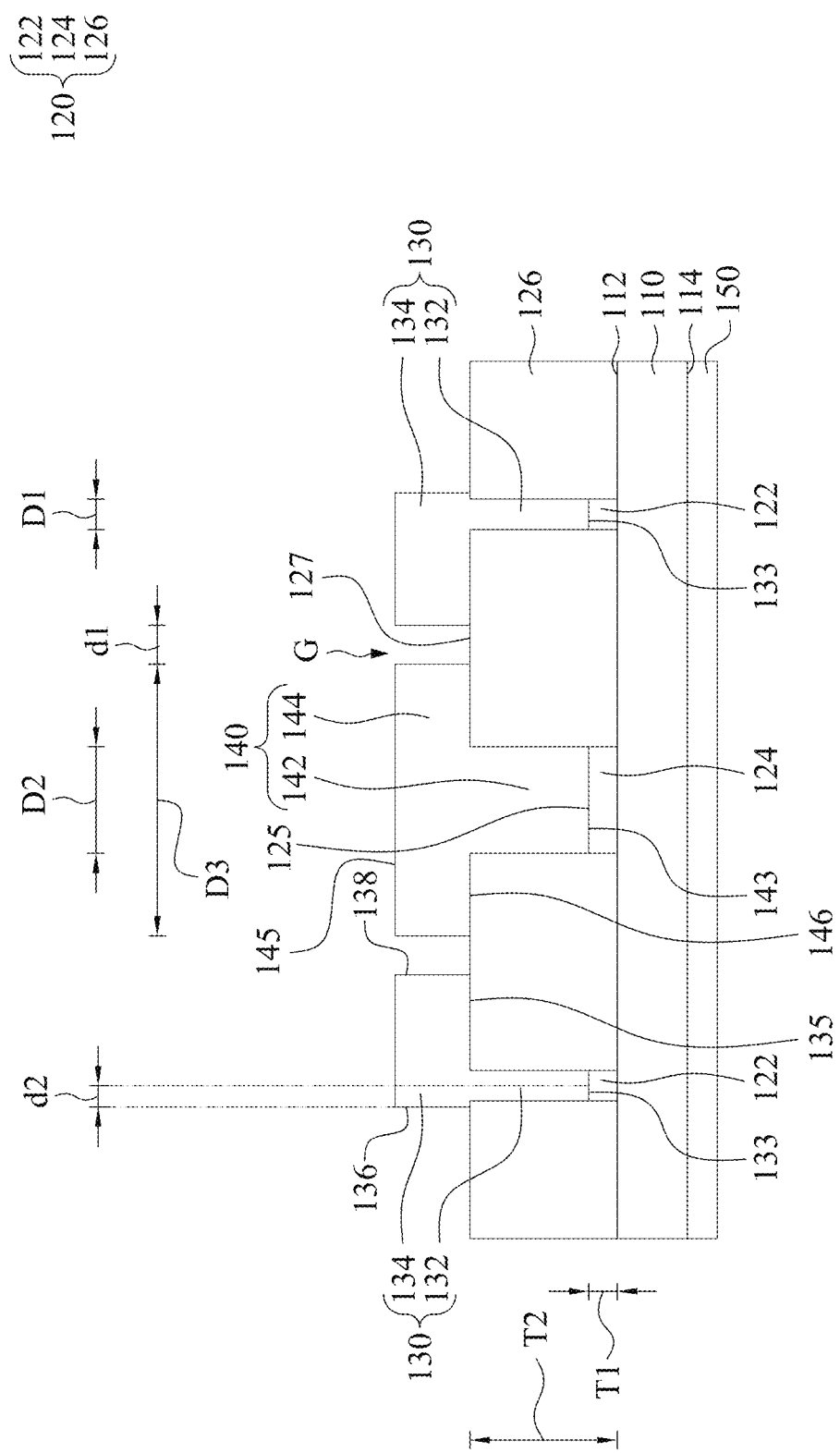
FIG. 1B is a cross-sectional view taken along line B-B in FIG. 1A.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

This disclosure relates to semiconductor device fabrications and more specifically to charge-coupled transistor formations by forming the transistor with a different-dielectric-thickness structure to obtain ultra-low subthreshold swing (SS). Such structure and its method provide a new type transistor and do not add area burden to the device.

FIG. 1A is a top view of a semiconductor device, in accordance with some embodiments, and FIG. 1B is a cross-sectional view taken along line B-B in FIG. 1A. The semiconductor device includes a substrate 110, a dielectric structure 120, a gate electrode 130, a drain electrode 140, and a source electrode 150. The dielectric structure 120 is on a front-side 112 of the substrate 110 and includes first portions 122, a second portion 124, and a third portion 126. The gate electrode 130 and the drain electrode 140 are over the dielectric structure 120. The source electrode 150 is on a backside 114 of the substrate 110.

Figure 1C:
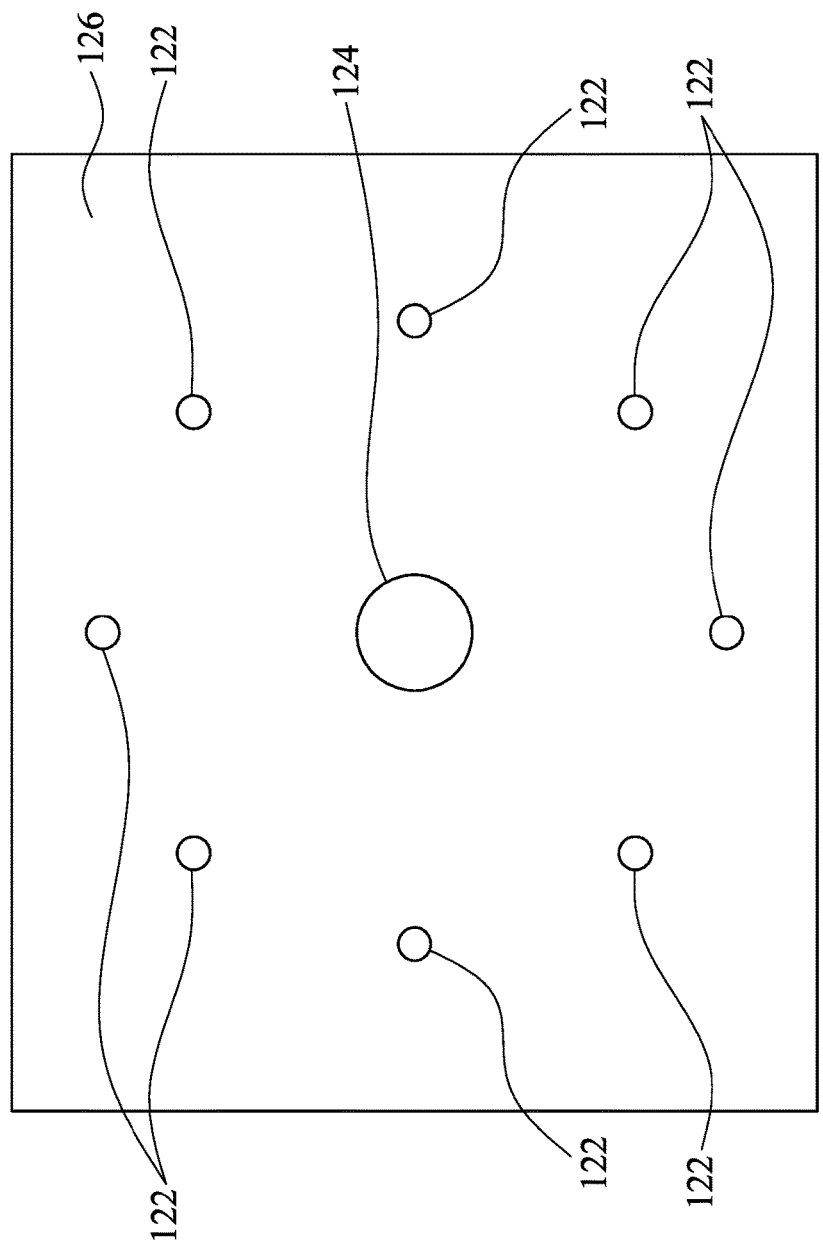
FIG. 1C is a top view of a dielectric structure in FIG. 1A, in accordance with some embodiments.

FIG. 1C is a top view of the dielectric structure 120 in FIG. 1A, in accordance with some embodiments. Reference is made to FIGS. 1B and 1C. An equivalent oxide thickness (EOT) of the third portion 126 of the dielectric structure 120 is greater than an EOT of the first portions 122 (the second portion 124). For examples, the EOT of the first portions 122 and the EOT of the second portion 124 of the dielectric structure 120 are less than about 2.5 nm. EOT is a distance, usually given in nanometers, which indicates how thick a silicon oxide film would be to produce the same effect as a dielectric material being used. That is, the EOT of the first portions 122 (the second portion 124) is equal to a thickness T1 of the first portions 122 (the second portion 124) when the first portions 122 (the second portion 124) is made of silicon oxide. In some embodiments, 0<T1≤2.5 nm when the first portions 122 (the second portion 124) is made of silicon oxide. If the EOT of the first portions 122 is greater than about 2.5 nm, the subthreshold swing of the semiconductor device may be increased. If the EOT of the second portion 124 is greater than about 2.5 nm, the turn-on drain current of the semiconductor device may be decreased.

The EOT of the third portion 126 of the dielectric structure 120 is in a range of about 2.5 nm to about 4 nm. Further, the EOT of the third portion 126 is equal to a thickness T2 of the third portion 126 when the third portion 126 is made of silicon oxide. As such, 2.5 nm≤T2≤4 nm when the third portion 126 is made of silicon oxide. If the EOT of the third portion 126 is greater than about 4 nm, the tunneling of electrons in the gate electrode 130 may have low efficiency.

The first portions 122 and the second portion 124 of the dielectric structure 120 are spaced apart from each other. In some embodiments, the first portions 122 are arranged as a circle or a ring that surrounds the second portion 124. In some embodiments, a size/diameter D2 of the second portion 124 is greater than a size/diameter D1 of each of the first portions 122. In some embodiments, the shape of each of the first portions 122 and the second portion 124 is a circle, a square, or other suitable shapes. The third portion 126 of the dielectric structure 120 laterally surrounds the first portions 122 and the second portion 124. That is, the first portions 122 and the second portion 124 are separated from each other by the third portion 126.

Reference is made to FIGS. 1A and 1B. For clarity, the first portions 122 and the second portion 124 of the dielectric structure 120 are illustrated in dashed lines in FIG. 1A. The drain electrode 140 is on the dielectric structure 120 and covers the second portion 124. The drain electrode 140 is spaced apart from the first portions 122. The gate electrode 130 is on the dielectric structure 120 and covers the first portions 122. Further, the gate electrode 130 is spaced apart from the second portion 124. The gate electrode 130 laterally surrounds the drain electrode 140.

The drain electrode 140 includes a bottom portion 142 and a top portion 144 on the bottom portion 142. The bottom portion 142 is in contact with the second portion 124 of the dielectric structure 120 and laterally surrounded by the third portion 126 of the dielectric structure 120. In other words, the bottom portion 142 is embedded in the dielectric structure 120, such that a bottom surface 143 of the bottom portion 142 is lower than a top surface 127 of the third portion 126 of the dielectric structure 120. The top portion 144 is on the third portion 126 of the dielectric structure 120. That is, a bottom surface 146 of the top portion 144 is in contact with the top surface 127 of the third portion 126 of the dielectric structure 120. As shown in FIGS. 1A and 1B, a diameter D3 of the top portion 144 of the drain electrode 140 is greater than a diameter D2 of the second portion 124 of the dielectric structure 120. In some embodiments, the diameters D2 and D3 satisfy: 0<D2≤0.5 D3. Alternatively, a surface area of a top surface 125 of the second portion 124 is smaller than or substantially equal to a quarter of a surface area of a top surface 145 of the drain electrode 140. In some embodiments, the top portion 144 of the drain electrode 140 and the second portion 124 of the dielectric structure 120 are concentric circles in a top view (see FIG. 1A). That is, a centroid of the top portion 144 of the drain electrode 140 substantially overlaps with a centroid of the second portion 124 of the dielectric structure 120.

The gate electrode 130 includes a plurality of bottom portions 132 and a top portion 134 on the bottom portions 132. The bottom portions 132 are in contact with the first portion 122 of the dielectric structure 120 and laterally surrounded by the third portion 126 of the dielectric structure 120. In other words, the bottom portions 132 are embedded in the dielectric structure 120, such that bottom surfaces 133 of the bottom portions 132 are lower than the top surface 127 of the third portion 126 of the dielectric structure 120. The top portion 134 of the gate electrode 130 is on the third portion 126 of the dielectric structure 120 and connecting the bottom portions 132 of the gate electrode 130. That is, a bottom surface 136 of the top portion 134 is in contact with the top surface 127 of the third portion 126 of the dielectric structure 120 in some embodiments.

Figure 2A:
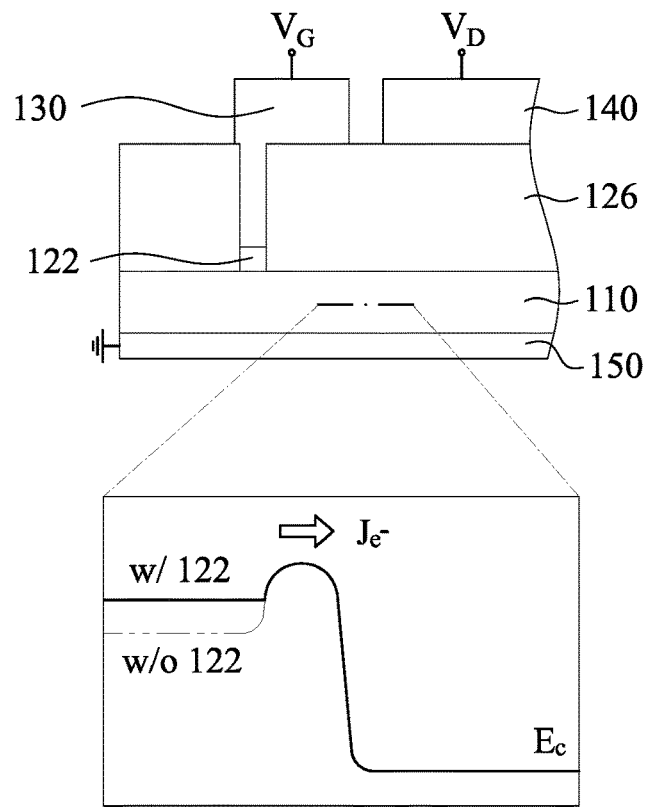
FIG. 2A is an illustrative band diagram of the semiconductor device with applied gate and drain voltages.
Figure 2B:
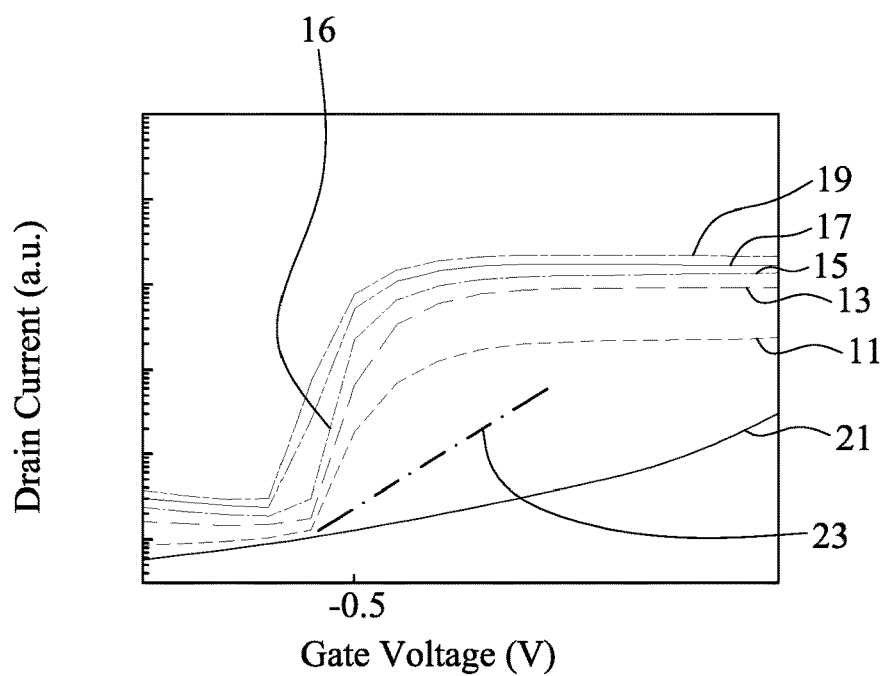
FIG. 2B is a simulated Id-Vg curve of the semiconductor device according to some embodiments.

With the first portions 122 of the dielectric structure 120, the subthreshold swing (SS) of the semiconductor device can be reduced (e.g., lower than about 60 mV/dec). FIG. 2A is an illustrative band diagram of the semiconductor device with applied gate and drain voltages, and FIG. 2B is a simulated Id-Vg curve of the semiconductor device according to some embodiments. The dashed lines 11, 13, 15, 17, and 19 in FIG. 2B represent the Id-Vg curve with first portions of the dielectric structure, and the solid line 21 in FIG. 2B represents the Id-Vg curve without first portions of the dielectric structure. For example, the dashed line 11 represents Id-Vg curve with single first portion, the dashed line 13 represents Id-Vg curve with four first portions, the dashed line 15 represents Id-Vg curve with six first portions, the dashed line 17 represents Id-Vg curve with eight first portions, and the dashed line 19 represents Id-Vg curve with twelve first portions. In the simulation of FIG. 2B, the EOT of the third portion was about 36.5 angstroms, the EOT of the first portion(s) was about 19 angstroms, and the diameter of the gate electrode was about 60 um. As shown in FIG. 2A, with the first portion 122 covered by the gate electrode 130, the electron energy band under the gate electrode 130 is raised, and more electrons in the gate electrode 130 can be coupled to the drain electrode 140, such that a drain current of the semiconductor device is increased as shown in FIG. 2B. For example, the curve 16 shows low SS, which was about 15.4 mV/dec at about −0.52 V. On contrary, the solid line 21 in FIG. 2B has a greater SS, which is greater than about 60 mV/dec (i.e., the line 23).

Figure 3A:
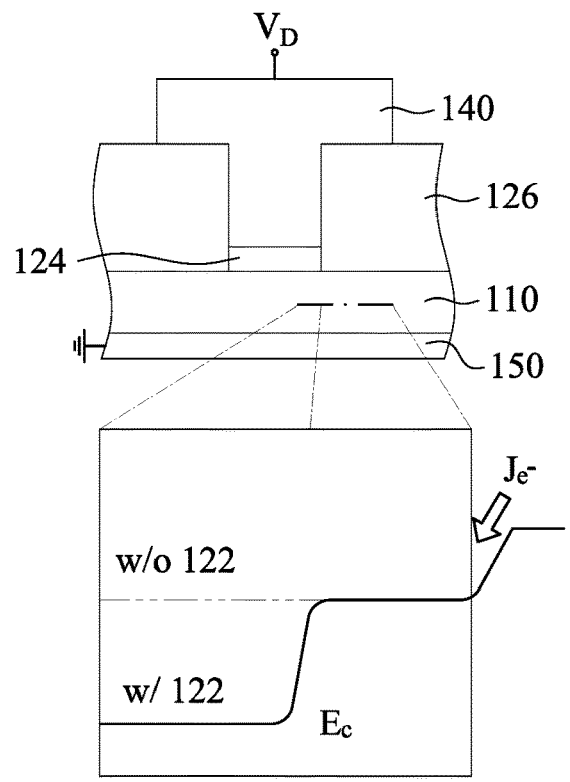
FIG. 3A is an illustrative band diagram of the semiconductor device with applied drain voltage.
Figure 3B:
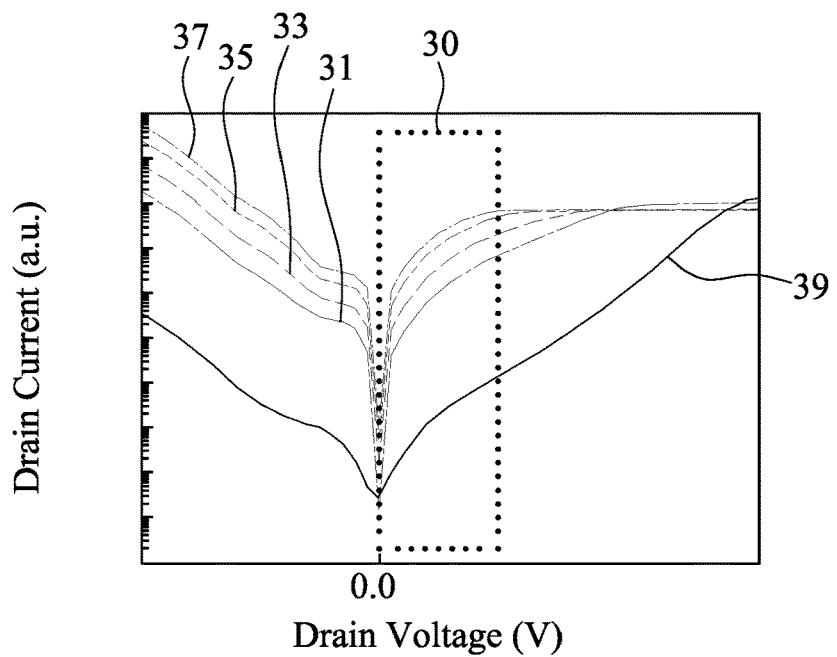
FIG. 3B is a simulated Id-Vd curve of the semiconductor device according to some embodiments.

With the second portion 124 of the dielectric structure 120, the turn-on drain current of the semiconductor device is enhanced at low drain voltage level. FIG. 3A is an illustrative band diagram of the semiconductor device with applied drain voltage, and FIG. 3B is a simulated Id-Vd curve of the semiconductor device according to some embodiments. The dashed lines 31, 33, 35, and 37 in FIG. 3B represent the Id-Vd curves with a second portion of the dielectric structure, and the solid line 39 in FIG. 3B represents the Id-Vd curve without the second portion of the dielectric structure. For example, the dashed line 31 represents Id-Vd curve with a 20-nm-diameter second portion, the dashed line 33 represents Id-Vd curve with a 30-nm-diameter second portion, the dashed line 35 represents Id-Vd curve with a 50-nm-diameter second portion, and the dashed line 37 represents Id-Vd curve with a 70-nm-diameter second portion. In the simulation of FIG. 3B, the EOT of the third portion was 36.5 angstroms, and the EOT of the first portion(s) was 19 angstroms. As shown in FIG. 3A, with the second portion 124 covered by the drain electrode 140, the electron energy band under the second portion 124 is lowed to form a deep depletion under the second portion 124, such that a drain current of the semiconductor device is increased as shown in FIG. 3B. For example, the drain currents are apparently increased at the low drain voltage region 30. On contrary, the solid line 39 in FIG. 3B has a lower drain current in the low drain voltage region 30.

Reference is made to FIGS. 1A and 1B. The top portion 134 of the gate electrode 130 has an outer diameter D4 and an inner diameter D5. The outer diameter D4 of the top portion 134 of the gate electrode 130 is greater than the inner diameter D5 of the top portion 134 of the gate electrode 130, which is greater than the diameter D3 of the top portion 144 of the drain electrode 140. A gap G is between the gate electrode 130 and the drain electrode 140, and a distance d1 between the gate electrode 130 and the drain electrode 140 is greater than 0 and less than about 30 um. If the distance d1 is greater than about 30 um, a coupling efficiency between the gate electrode 130 and the drain electrode 140 may be reduced.

In some embodiments, the number of the first portions 122 of the dielectric structure 120 is greater than 1 and may be in a range of 1 to about 20. The profiles of drain current-gate voltage (Id-Vg) curves of semiconductor devices having greater than about ten first portions are similar. The first portions 122 of the dielectric structure 120 are closer to an outer sidewall 136 of the gate electrode 130 than to an inner sidewall 138 of the gate electrode 130 in the top view. For example, a lateral distance d2 between the outer sidewall 136 of the gate electrode 130 and a centroid of each of the first portions 122 of the dielectric structure 120 satisfies 0<d2<0.6 D4. If the lateral distance d2 is greater than about 0.6 times of the outer diameter D4, the first portions 122 may be closer to the drain electrode 140, and the off current of the semiconductor device is dramatically increased. Further, each of the first portions 122 has the diameter (or maximum width) D1 satisfies: 0<D1≤0.4 D4. If the diameter D1 is greater than about 0.4 times of the outer diameter D4, the first portions 122 may be closer to the drain electrode 140, and the off current of the semiconductor device is dramatically increased. Moreover, a (minimum) distance d3 is between adjacent two of the first portions 122. In some embodiments, the distance d3 satisfies:

$$\frac{\pi(D4 - 2(d2))}{12} \le d3 \le D4$$

Figure 4:
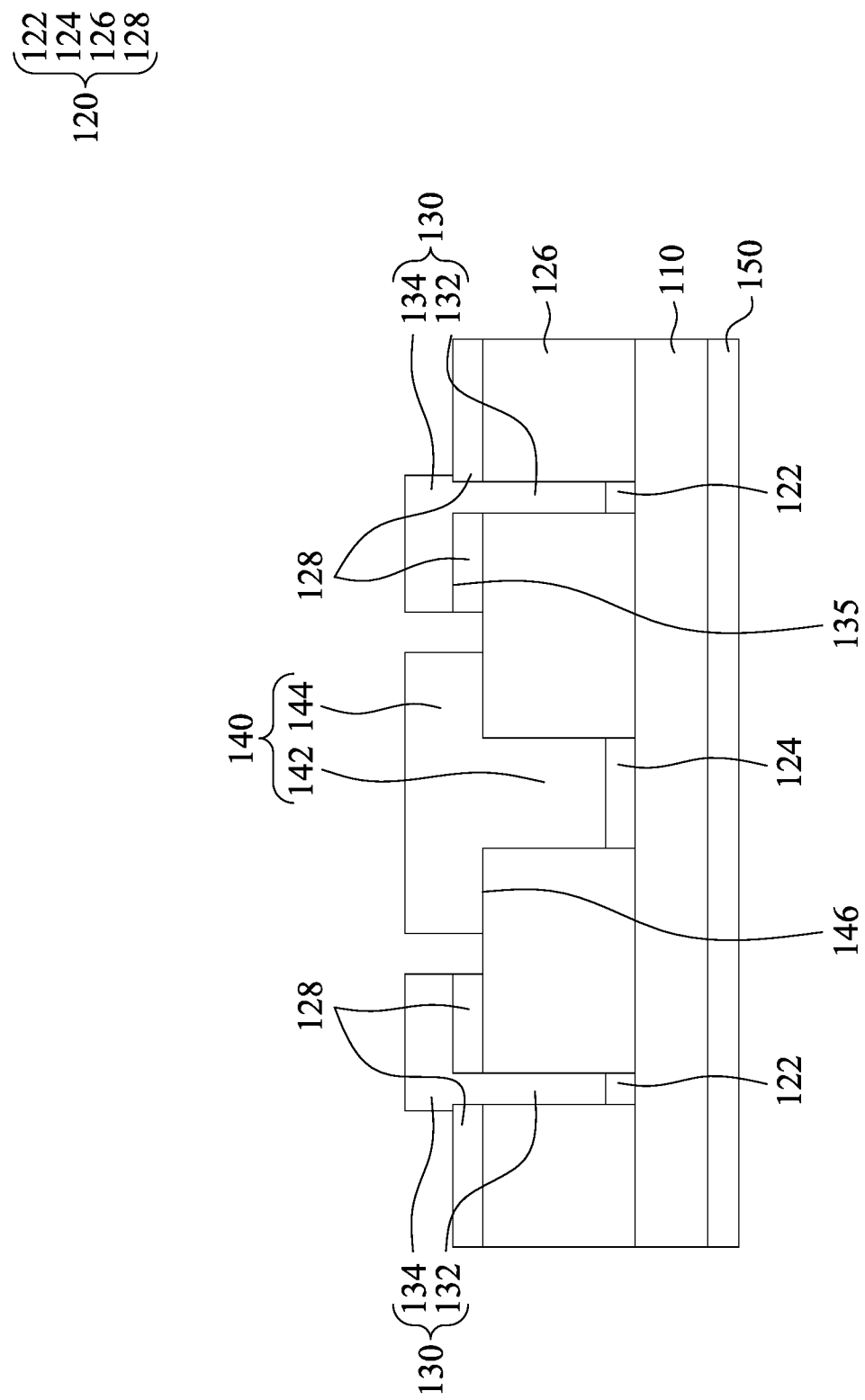
FIG. 4 is a cross-sectional view of a semiconductor device, in accordance with some embodiments.

FIG. 4 is a cross-sectional view of a semiconductor device, in accordance with some embodiments. FIGS. 4 and 1B have the same cross-sectional position. The difference between the semiconductor devices in FIGS. 4 and 1B pertains to the presence of a high-k dielectric layer. In FIG. 4, the dielectric structure 120 further includes a high-k dielectric layer 128 above the third portion 126. Specifically, the high-k dielectric layer 128 is between the third portion 126 and the gate electrode 130 and is spaced apart from the drain electrode 140. As such, the bottom surface 135 of the top portion 134 of the gate electrode 130 is higher than the bottom surface 146 of the top portion 144 of the drain electrode 140. The high-k dielectric layer 128 is configured to increase the amount of electrons in the gate electrode 130. Moreover, the high-k dielectric layer 128 also improves current leakage issues in the gate electrode 130. In some embodiments, the high-k dielectric layer 128 has an EOT greater than 0 and less than about 6 nm. If the EOT is greater than about 6 nm, the tunneling of electrons in the gate electrode 130 may have low efficiency. Other relevant structural details of the semiconductor device in FIG. 4 are substantially the same as or similar to the semiconductor devices in FIGS. 1A and 1B, and, therefore, a description in this regard will not be repeated hereinafter.

Figure 5:
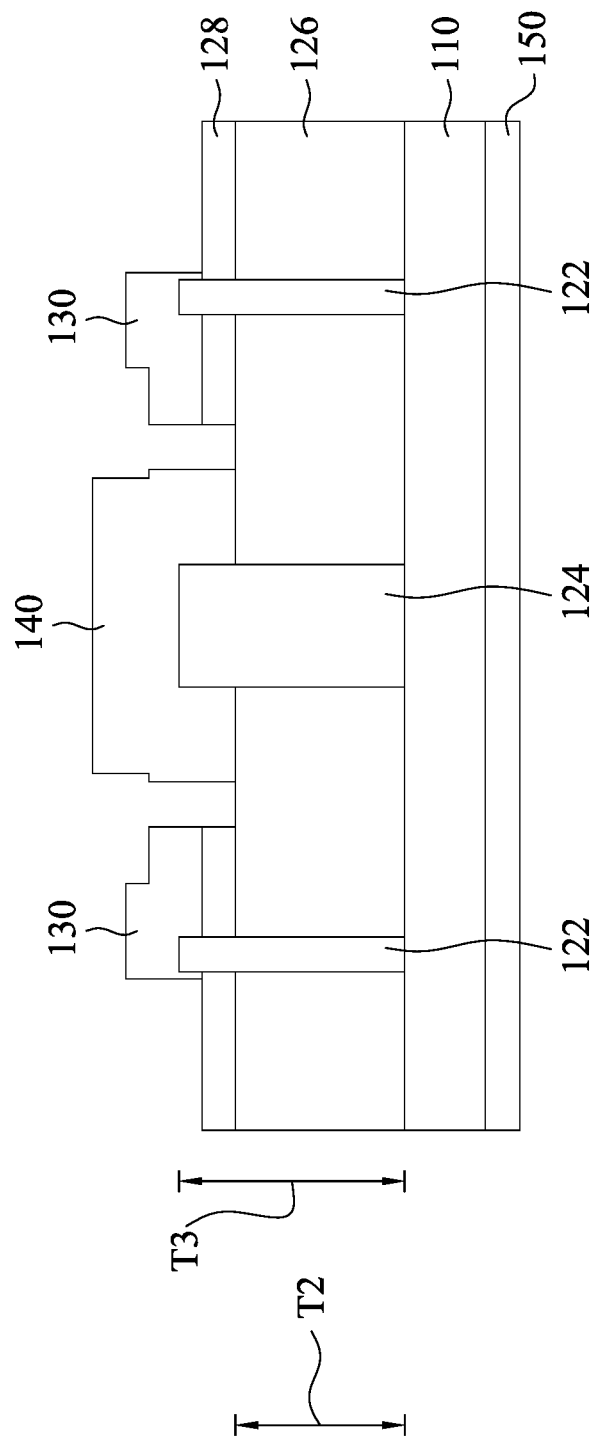
FIG. 5 is a cross-sectional view of a semiconductor device, in accordance with some embodiments.

FIG. 5 is a cross-sectional view of a semiconductor device, in accordance with some embodiments. FIGS. 5 and 4 have the same cross-sectional position. The difference between the semiconductor devices in FIGS. 5 and 4 pertains to the material of the first portions 122 and the second portion 124 of the dielectric structure 120. In FIG. 5, the first portions 122 and the second portion 124 are made of high-k materials. As such, a thickness T3 of the first portions 122 and the second portion 124 may be greater than the thickness T2 of the third portion 126. However, the EOT of the first portions 122 and the second portion 124 are still less than the EOT of the third portion 126. In some embodiments, depending on the material of the first portions 122 and the second portion 124, the thickness T3 can be greater than 0 and less than about 100 nm. Other relevant structural details of the semiconductor device in FIG. 5 are substantially the same as or similar to the semiconductor devices in FIGS. 1A, 1B, and 4, and, therefore, a description in this regard will not be repeated hereinafter.

Figure 6:
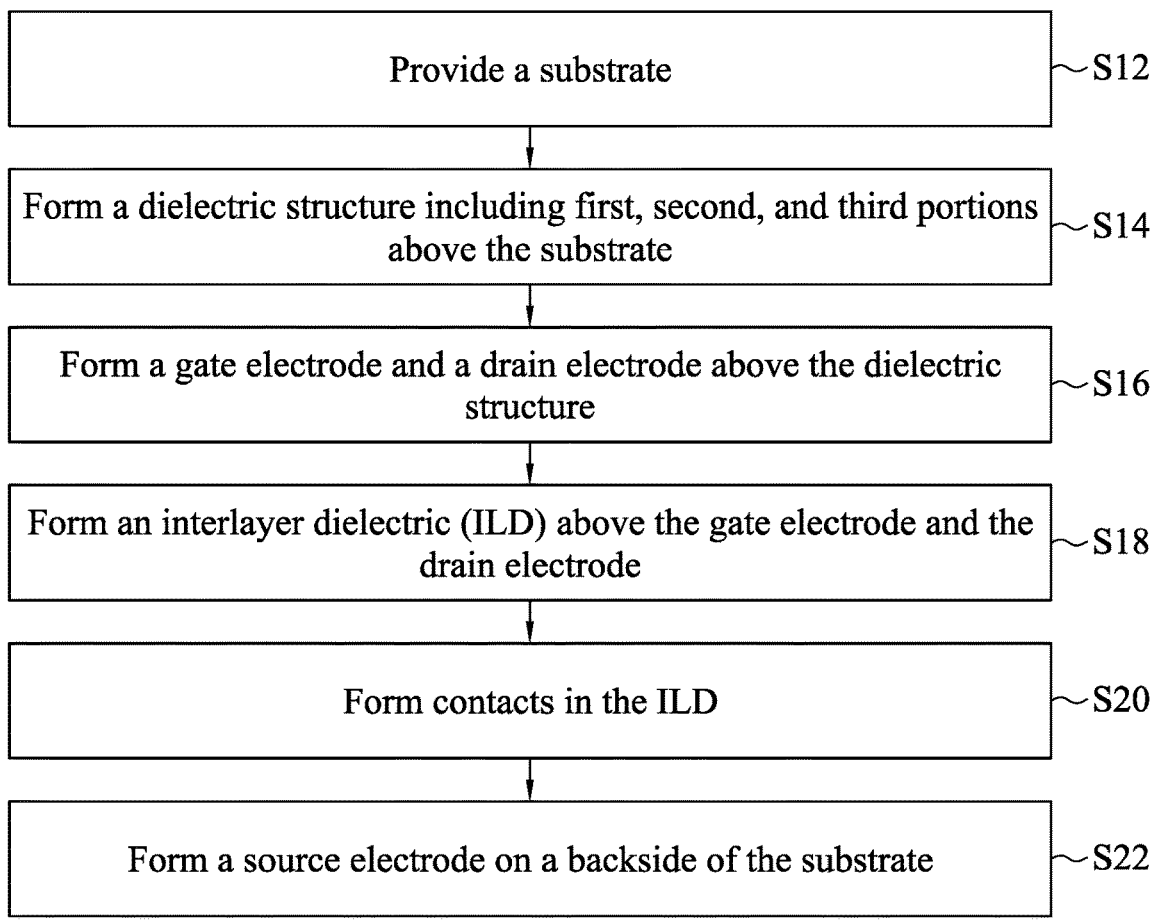
FIG. 6 is a flowchart of a method for making a semiconductor device according to aspects of the present disclosure in various embodiments.
Figure 7G:
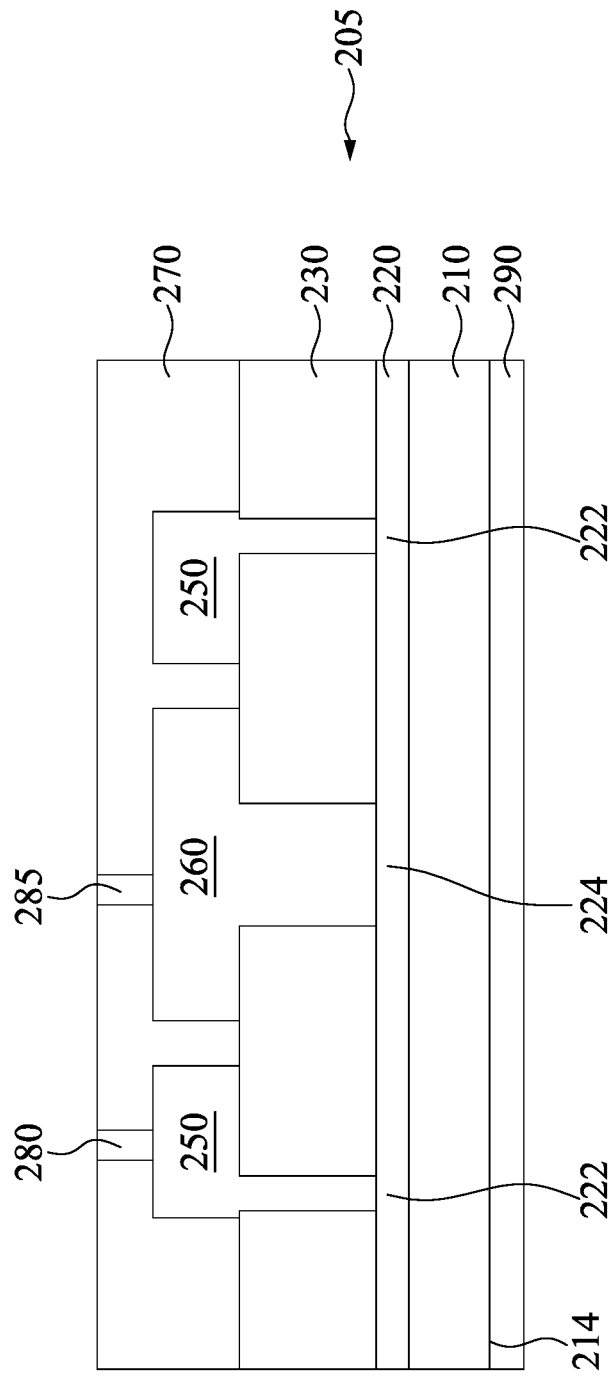

FIG. 6 is a flowchart of a method M10 for making a semiconductor device (e.g., the semiconductor device in FIGS. 1A-1B, 4, and/or 5) according to aspects of the present disclosure in various embodiments. Various operations of the method M10 are discussed in association with cross-section diagrams FIGS. 7A-7G. In operation S12 of method M10 of FIG. 6, a substrate is provided. In some embodiments, as shown in FIG. 7A, a substrate 210 may be a semiconductor material and may include a graded layer or a buried oxide, for example. In some embodiments, the substrate 210 includes bulk silicon that may be undoped or doped (e.g., p-type, n-type, or a combination thereof). Other materials that are suitable for semiconductor device formation may be used. Other materials, such as germanium, GaAs, quartz, sapphire, and glass could alternatively be used for the substrate 210. Alternatively, the silicon substrate 210 may be an active layer of a semiconductor-on-insulator (SOI) substrate or a multi-layered structure such as a silicon-germanium layer formed on a bulk silicon layer. In some embodiments, the substrate 210 includes a p-type substrate (p-substrate). For example, p-type dopants are introduced into the substrate 210 to form the p-substrate.

In operation S14 of method M10 of FIG. 6, a dielectric structure including first, second, and third portions is formed above the substrate. In some embodiments, as shown in FIG. 7B, a first dielectric layer 220 and a second dielectric layer 230 are subsequently formed over a front-side 212 of the substrate 210. In some embodiments, each of the first dielectric layer 220 and the second dielectric layer 230 includes silicon dioxide, silicon nitride, or other suitable material. For example, both the first dielectric layer 220 and the second dielectric layer 230 are made of silicon dioxide. In various examples, each of the first dielectric layer 220 and the second dielectric layer 230 may be deposited by an anodization process, an ALD process, a CVD process, a subatmospheric CVD (SACVD) process, a flowable CVD process, a PVD process, or other suitable process. For example, the first dielectric layer 220 is deposited by an anodization process or a thermal oxidation process, and the second dielectric layer 230 is deposited by a CVD process, such that an interface may be formed between the first dielectric layer 220 and the second dielectric layer 230. With such configuration, a quality of the first dielectric layer 220 is higher than a quality of the second dielectric layer 230. For example, the first dielectric layer 220 is denser than the second dielectric layer 230. Alternatively, the first dielectric layer 220 and the second dielectric layer 230 are deposited by using the same deposition process, and there is no interface between the first dielectric layer 220 and the second dielectric layer 230.

Subsequently, the second dielectric layer 230 is patterned to form first openings 232 and a second opening 234 in the second dielectric layer 230, as shown in FIG. 7B. As such, portions of the first dielectric layer 220 are exposed by the first openings 232 and/or the second opening 234 of the second dielectric layer 230. For example, a mask M1 is formed over the second dielectric layer 230, and portions of the second dielectric layer 230 are exposed by the mask M1. Subsequently, the second dielectric layer 230 is patterned by using the mask M1 as an etching mask, and the first openings 232 and the second opening 234 are formed in the second dielectric layer 230. The mask M1 can be removed after the formation of the first openings 232 and the second opening 234 by using an ashing or etching process.

The first dielectric layer 220 and the patterned second dielectric layer 230 can be referred to be the dielectric structure 205, which is similar to the dielectric structure 120 shown in FIG. 1C. That is, first portions 222 of the first dielectric layer 220 exposed by the first openings 232 of the second dielectric layer 230 correspond to the first portions 122 of the dielectric structure 120 in FIG. 1C, a second portion 224 of the first dielectric layer 220 exposed by the second opening 234 of the second dielectric layer 230 corresponds to the second portion 124 of the dielectric structure 120 in FIG. 1C, and the patterned second dielectric layer 230 and a portion of the first dielectric layer 220 covered by the patterned second dielectric layer 230 correspond to the third portion 126 of the dielectric structure 120 in FIG. 1C.

In operation S16 of method M10 of FIG. 6, a gate electrode and a drain electrode are formed above the dielectric structure. For example, as shown in FIG. 7C, a conductive layer 240 is formed above the dielectric structure 205. The conductive layer 240 fills the first openings 232 and the second opening 234 (see FIG. 7B) and covers the dielectric structure 205. In some embodiments, the conductive layer 240 is made of semiconductor such as polysilicon, or metal-containing material such as aluminum (Al), titanium nitride (TiN), tantalum nitride (TaN), tantalum carbon (TaC), cobalt (Co), ruthenium (Ru), combinations thereof, multi-layers thereof, and the like. In some embodiments, the conductive layer 240 is formed using physical vapor deposition (PVD), ALD, CVD, or the like.

Subsequently, the conductive layer 240 is patterned to be the gate electrode 250 and the drain electrode 260 as shown in FIG. 7D. As such, the gate electrode 250 covers the first portions 222 of the dielectric structure 205, and the drain electrode 260 covers the second portion 224 of the dielectric structure 205. The dimensions of the gate electrode 250 and the drain electrode 260 are similar to or substantially the same as the gate electrode 130 and the drain electrode 140 of FIGS. 1A and 1B, and, therefore, a description in this regard will not be repeated hereinafter.

In operation S18 of method M10 of FIG. 6, an interlayer dielectric (ILD) is formed above the gate electrode and the drain electrode. As shown in FIG. 7E, the ILD 270 is deposited over the gate electrode 250 and the drain electrode 260 and fills the gap G between the gate electrode 250 and the drain electrode 260. In some embodiments, the deposition process may be chemical vapor deposition (CVD), high-density plasma CVD, spin-on, sputtering, or other suitable methods. In some embodiments, the ILD 270 includes silicon oxide. In some other embodiments, the ILD 270 may include silicon oxy-nitride, silicon nitride, or a low-k material.

In operation S20 of method M10 of FIG. 6, contacts are formed in the ILD. In FIG. 7F, openings are formed in the ILD 270 in advance, and conductive materials are deposited in the openings of the ILD 270. In some embodiments, the conductive materials may be made of metal, such as W, Co, Ru, Al, Cu, or other suitable materials. After the deposition of the conductive materials, a planarization process, such as a chemical mechanical planarization (CMP) process, may be then performed to form contacts 280 and 285. The contact 280 is electrically connected to the gate electrode 250, and the contact 285 is electrically connected to the drain electrode 260. In some embodiments, barrier layers may be formed in the openings before the formation of the contacts 280 and 285. The barrier layers may be made of TiN, TaN, or combinations thereof.

In operation S22 of method M10 of FIG. 6, a source electrode is formed on a backside of the substrate. For example, in FIG. 7G, the source electrode 290 is formed on the backside 214 of the substrate 210. Specifically, another conductive layer is deposited on the backside 214 of the substrate 210, and the conductive layer is patterned to be the source electrode 290. In some embodiments, the source electrode 290 is made of semiconductor such as polysilicon, or metal-containing material such as aluminum (Al), titanium nitride (TiN), tantalum nitride (TaN), tantalum carbon (TaC), cobalt (Co), ruthenium (Ru), combinations thereof, multi-layers thereof, and the like. In some embodiments, the conductive layer is deposited using physical vapor deposition (PVD), ALD, CVD, or the like.

Figure 8A:
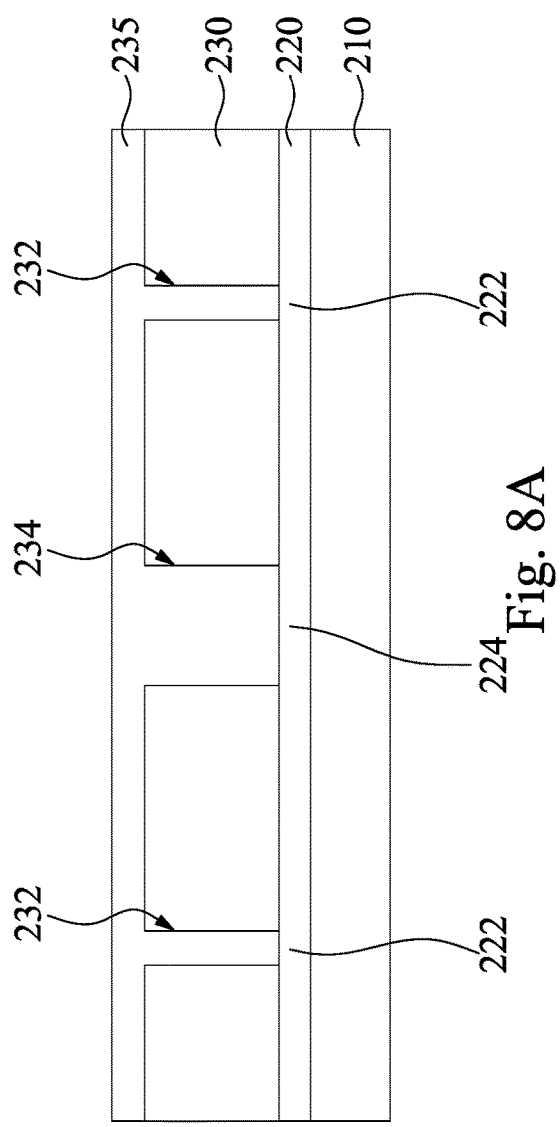
FIGS. 8A-8C illustrate the method for manufacturing a semiconductor device in different stages in accordance with some embodiments.
Figure 8B:
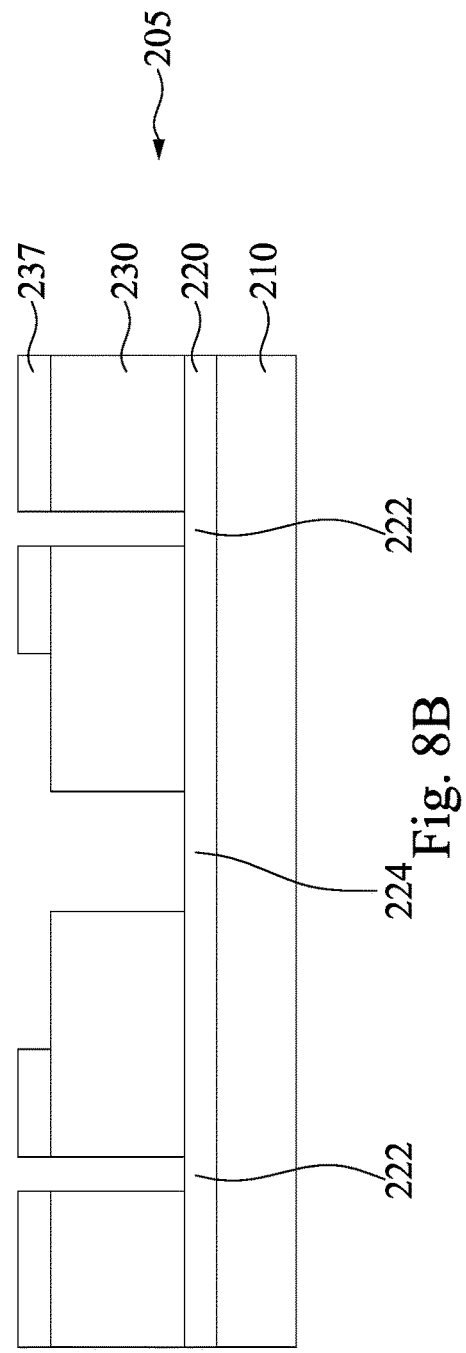
Figure 8C:
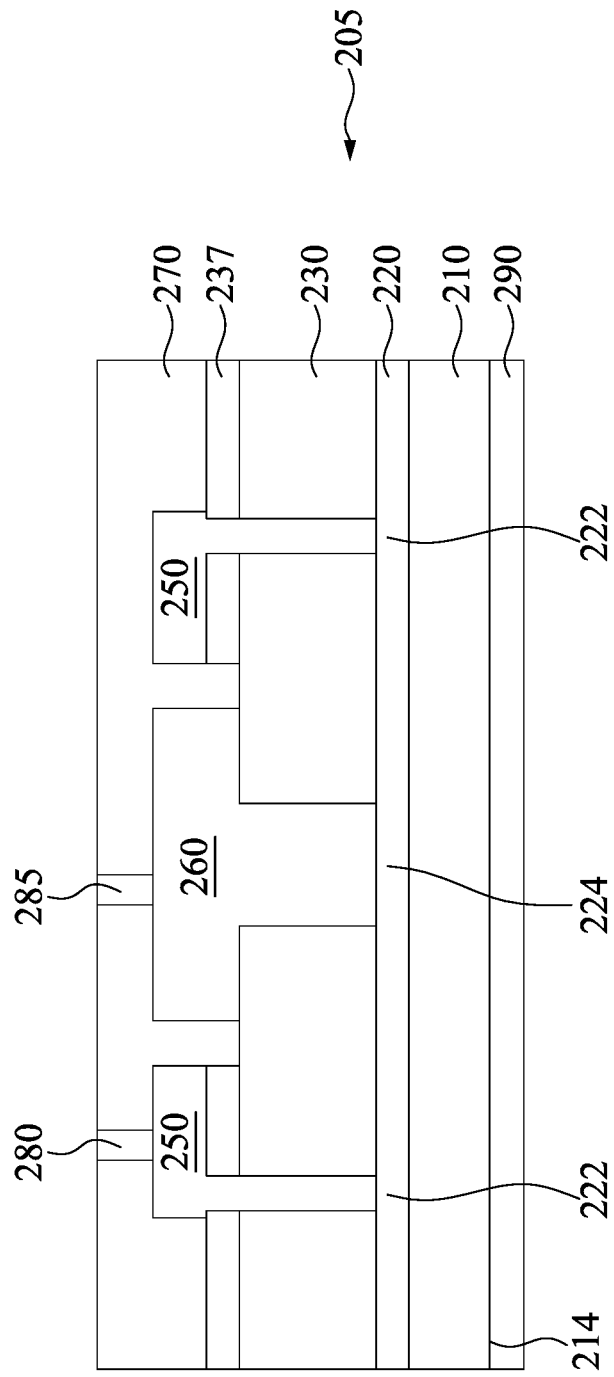

The formation of the dielectric structure is not limited to FIGS. 7A-7G. FIGS. 8A-8C illustrate the method M10 for manufacturing a semiconductor device in different stages in accordance with some embodiments. Throughout the various views and illustrative embodiments, like reference numbers are used to designate like elements. In operation S12 of method M10 of FIG. 6, a substrate 210 is provided, as shown in FIG. 8A.

In operation S14 of method M10 of FIG. 6, a dielectric structure including first, second, and third portions is formed above the substrate. Specifically, a first dielectric layer 220 and a second dielectric layer 230 are subsequently formed over a front-side 212 of the substrate 210. Subsequently, the second dielectric layer 230 is patterned to form first openings 232 and a second opening 234 in the second dielectric layer 230. A high-k dielectric film 235 is then formed above the second dielectric layer 230 and fills the first openings 232 and the second opening 234. In some embodiments, the high-k dielectric film 235 includes a high-k material (k is greater than 7) such as hafnium oxide ($HfO_2$), zirconium oxide ($ZrO_2$), lanthanum oxide ($La_2O_3$), hafnium aluminum oxide ($HfAlO_2$), hafnium silicon oxide ($HfSiO_2$), aluminum oxide ($Al_2O_3$), or other suitable materials. In some embodiments, the high-k dielectric film 235 may be formed by performing an ALD process, a CVD process, or other suitable process.

Reference is made to FIG. 8B. The high-k dielectric film 235 is patterned to be a high-k dielectric layer 237. As such, the high-k dielectric layer 237, the first dielectric layer 220, and the patterned second dielectric layer 230 are referred to as the dielectric structure 205.

In operation S16 of method M10 of FIG. 6, a gate electrode and a drain electrode are formed above the dielectric structure. For example, as shown in FIG. 8C, the gate electrode 250 is formed above the high-k dielectric layer 237, and the drain electrode 260 is formed above the second dielectric layer 230 and spaced apart from the high-k dielectric layer 237. In operation S18 of method M10 of FIG. 6, an ILD 270 is formed above the gate electrode 250 and the drain electrode 260, as shown in FIG. 8C. In operation S20 of method M10 of FIG. 6, contacts 280 and 285 are formed in the ILD 270, as shown in FIG. 8C. In operation S22 of method M10 of FIG. 6, a source electrode 290 is formed on a backside 214 of the substrate 210, as shown in FIG. 8C.

Figure 9A:
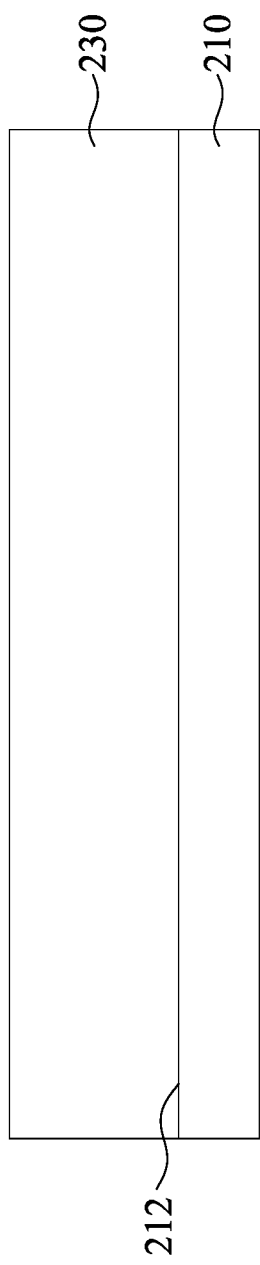

FIGS. 9A-9E illustrate the method M10 for manufacturing a semiconductor device in different stages in accordance with some embodiments. Throughout the various views and illustrative embodiments, like reference numbers are used to designate like elements. In operation S12 of method M10 of FIG. 6, a substrate 210 is provided, as shown in FIG. 9A. In operation S14 of method M10 of FIG. 6, a dielectric structure including first, second, and third portions is formed above the substrate. For example, a second dielectric layer 230 is formed above a front-side 212 of the substrate 210 as shown in FIG. 9A.

Figure 9B:
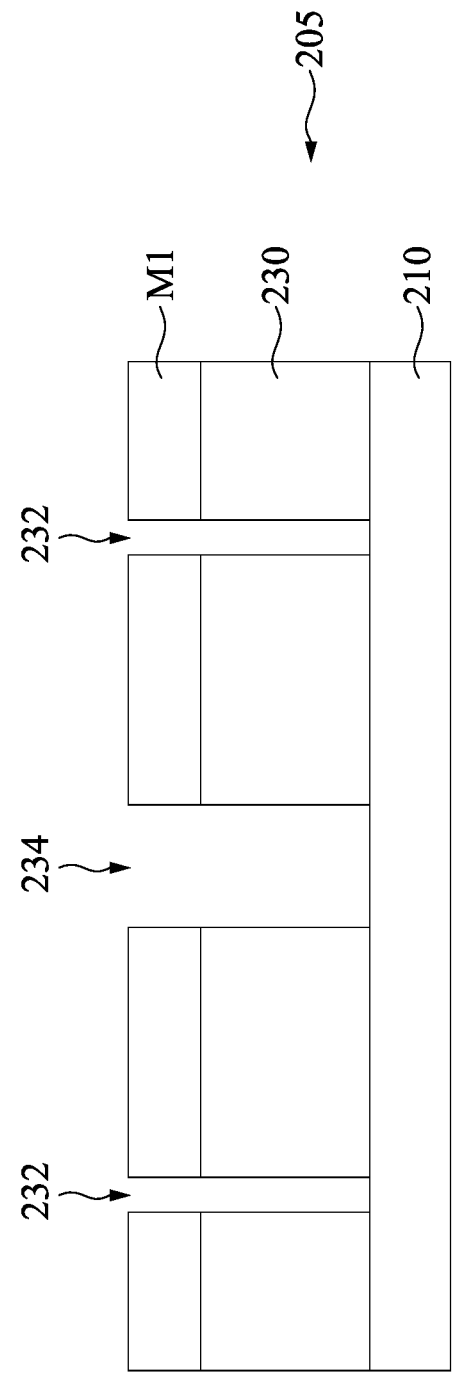

The second dielectric layer 230 is patterned to form first openings 232 and a second opening 234 therein by using a mask M1, as shown in FIG. 9B. As shown in FIG. 9C, first portions 222 and a second portion 224 of a dielectric material are respectively formed in the first openings 232 and the second opening 234, as shown in FIG. 9C. For example, the first portions 222 and the second portions 224 are formed by using a thermal oxidized process or other suitable processes. The patterned second dielectric layer 230 and the first dielectric layer 220 are referred to as a dielectric structure 205. In some other embodiments, the first portions 222 and the second portions 224 may be made of high-k materials and thicknesses thereof may be greater than the second dielectric layer 230 as shown in FIG. 5.

Figure 9E:
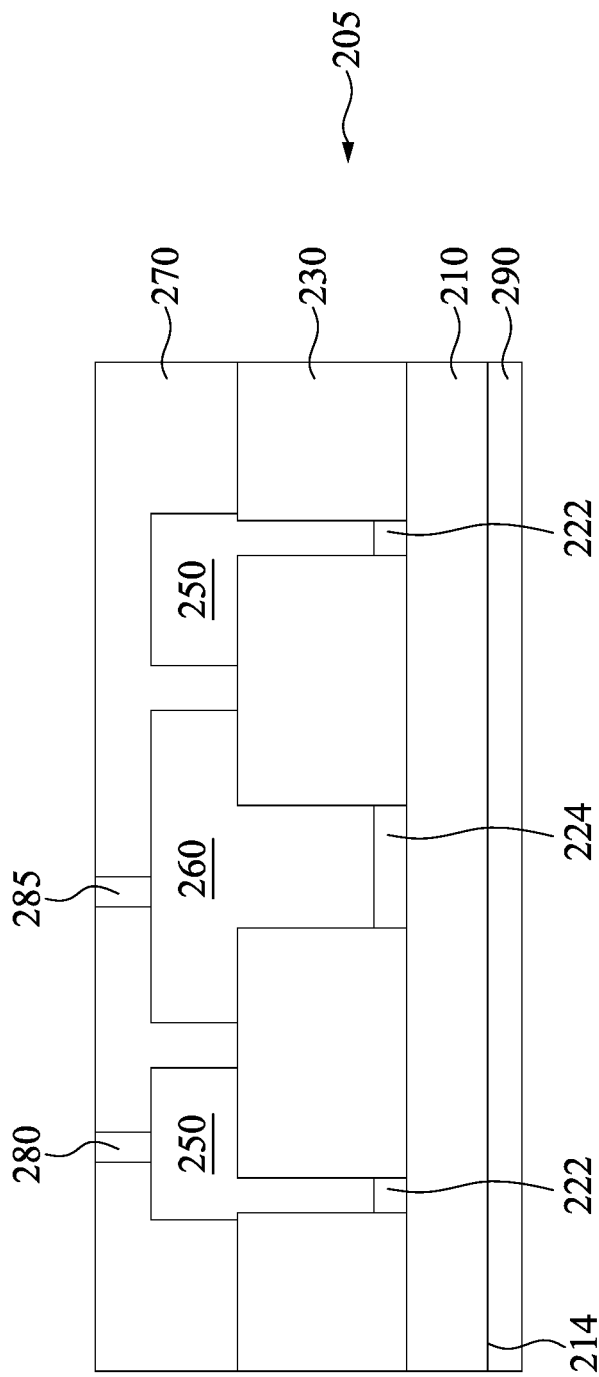

In operation S16 of method M10 of FIG. 6, a gate electrode 250 and a drain electrode 260 are formed above the dielectric structure 205, as shown in FIG. 9D. In operation S18 of method M10 of FIG. 6, an ILD 270 is formed above the gate electrode 250 and the drain electrode 260, as shown in FIG. 9E. In operation S20 of method M10 of FIG. 6, contacts 280 and 285 are formed in the ILD 270, as shown in FIG. 9E. In operation S22 of method M10 of FIG. 6, a source electrode 290 is formed on the backside 214 of the substrate 210, as shown in FIG. 9E.

Figure 10C:
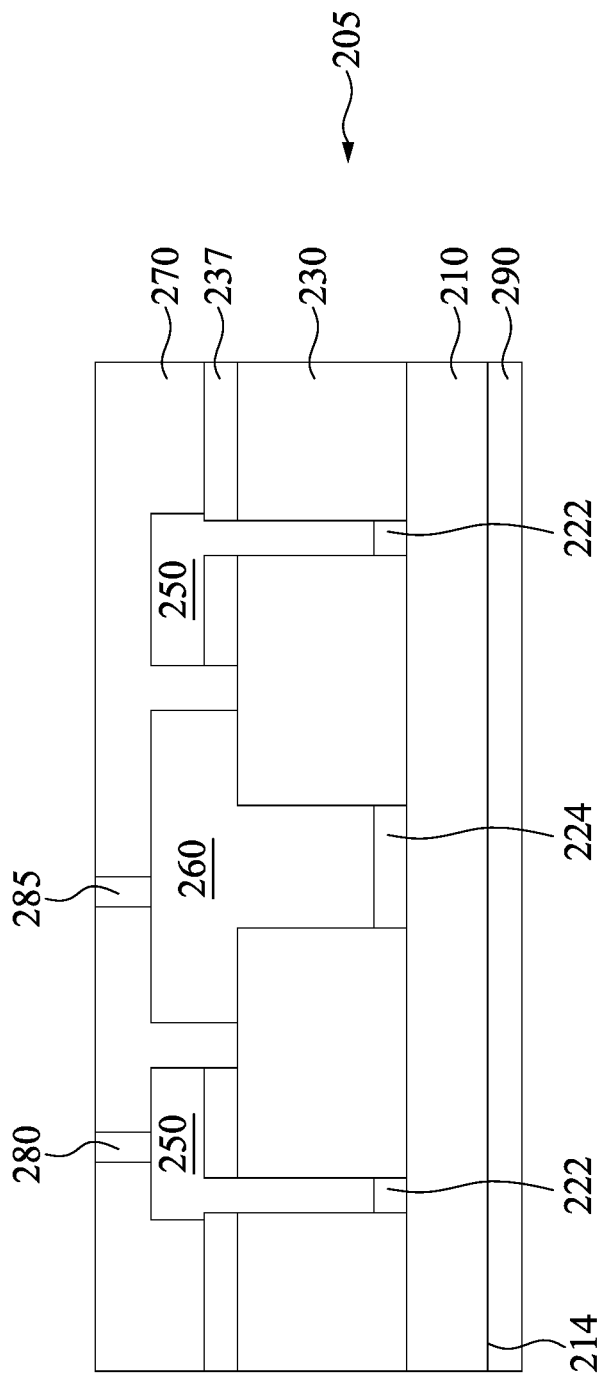

FIGS. 10A-10C illustrate the method M10 for manufacturing a semiconductor device in different stages in accordance with some embodiments. Throughout the various views and illustrative embodiments, like reference numbers are used to designate like elements. In operation S12 of method M10 of FIG. 6, a substrate 210 is provided, as shown in FIG. 10A.

In operation S14 of method M10 of FIG. 6, a dielectric structure including first, second, and third portions is formed above the substrate. Specifically, a second dielectric layer 230 is formed over a front-side 212 of the substrate 210 as shown in FIG. 10A. Subsequently, the second dielectric layer 230 is patterned to form first openings 232 and a second opening 234 in the second dielectric layer 230 as shown in FIG. 10B. A high-k dielectric layer 237 is then formed above the second dielectric layer 230. In some embodiments, the high-k dielectric layer 237 includes a high-k material (k is greater than 7) such as hafnium oxide ($HfO_2$), zirconium oxide ($ZrO_2$), lanthanum oxide ($La_2O_3$), hafnium aluminum oxide ($HfAlO_2$), hafnium silicon oxide ($HfSiO_2$), aluminum oxide ($Al_2O_3$), or other suitable materials. Subsequently, first portions 222 and a second portion 224 of a dielectric material are respectively formed in the first openings 232 and the second opening 234, as shown in FIG. 10B. For example, the first portions 222 and the second portions 224 are formed by using a thermal oxidized process or other suitable processes. As such, the high-k dielectric layer 237, the first dielectric layer 220, and the patterned second dielectric layer 230 are referred to as the dielectric structure 205.

In operation S16 of method M10 of FIG. 6, a gate electrode and a drain electrode are formed above the dielectric structure. For example, as shown in FIG. 10C, the gate electrode 250 is formed above the high-k dielectric layer 237, and the drain electrode 260 is formed above the second dielectric layer 230 and spaced apart from the high-k dielectric layer 237. In operation S18 of method M10 of FIG. 6, an ILD 270 is formed above the gate electrode 250 and the drain electrode 260, as shown in FIG. 10C. In operation S20 of method M10 of FIG. 6, contacts 280 and 285 are formed in the ILD 270, as shown in FIG. 10C. In operation S22 of method M10 of FIG. 6, a source electrode 290 is formed on a backside 214 of the substrate 210, as shown in FIG. 10C.

Figure 11E:
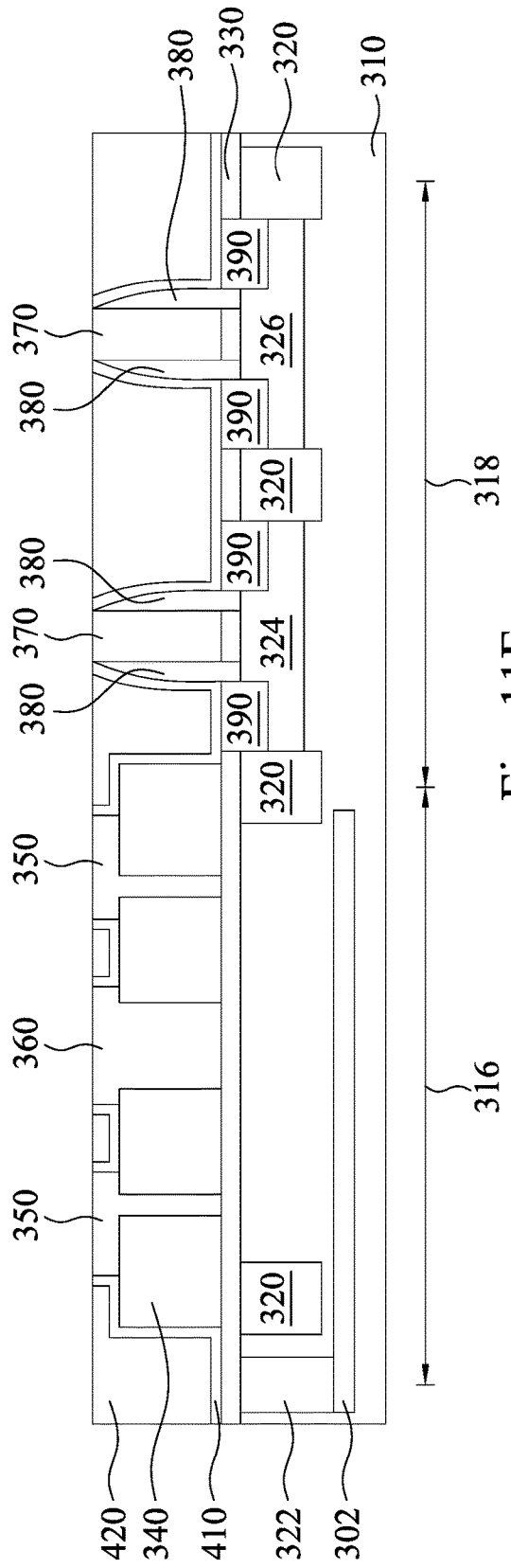

FIG. 11A-11G illustrate the method M10 for manufacturing a semiconductor device in different stages in accordance with some embodiments. In operation S12 of method M10 of FIG. 6, a substrate is provided, as shown in FIG. 11A. For example, as shown in FIG. 11A, a substrate 310 similar to the substrate 210 in FIG. 7A is provided. Further, the substrate 310 has a charge-coupled-transistor region 316 and an FET region 318. In some embodiments, the charge-coupled-transistor region 316 is adjacent to the FET region 318. In some other embodiments, the charge-coupled-transistor region 316 is spaced apart from the FET region 318 by a distance.

In some embodiments, an implantation region 302 is formed in the charge-coupled-transistor region 316 of the substrate 310. In some embodiments, the implantation region 302 is served as the source electrode 150 shown in FIG. 1B. Specifically, a mask layer (may be a hard mask layer) may be formed over the top surface of the substrate 310, and an opening is formed in the mask layer. An implantation process is then performed to introduce impurities into the charge-coupled-transistor region 316 of the substrate 310 to form the implantation region 302, and the patterned mask layer may act as a mask to substantially prevent the impurities from being implanted into other regions of the substrate 310. The implantation process may be a low energy implantation through the substrate 310 to a desirable depth D6 below the substrate surface (e.g., about 0.01 um to about 100 um below the substrate surface). The impurities may be p-type impurities or n-type impurities (e.g., p-type impurities in this case). The p-type impurities may be boron, $BF_2$, or the like, and the n-type impurities may be phosphorus, arsenic, or the like. Then, the photoresist and the patterned mask layer are removed.

Subsequently, as shown in FIG. 11B, a plurality of isolation structures 320 are formed in the substrate 310. The isolation structures 320 may be formed by chemical vapor deposition (CVD) techniques using tetra-ethyl-ortho-silicate (TEOS) and oxygen as a precursor. In some other embodiments, the isolation structures 320 may be formed by implanting ions, such as oxygen, nitrogen, carbon, or the like, into the substrate 310. In yet some other embodiments, the isolation structures 320 are insulator layers of a SOI wafer. The isolation structures 320, which act as shallow trench isolations (STIs), are formed in and/or between the charge-coupled-transistor region 316 and the FET region 318.

Well regions 322, 324, and 326 are then formed in the substrate 310. For example, another mask layer (may be a hard mask layer) may be formed over the top surface of the substrate 310, and a plurality of openings are formed in the mask layer. One or more implantation process(es) is then performed to introduce impurities into the substrate 310 to form the well regions 322, 324, and 326, and the patterned mask layer may act as a mask to substantially prevent the impurities from being implanted into other regions of the substrate 310. The impurities may be n-type impurities or p-type impurities. The n-type impurities may be phosphorus, arsenic, or the like, and the p-type impurities may be boron, $BF_2$, or the like. Then, the photoresist and the patterned mask layer are removed. In some embodiments, the well regions 322 and 326 have p-type impurities, and the well region 324 has n-type impurities, or vise versa. Further, the well region 322 is connected to the implantation region 302.

In operation S14 of method M10 of FIG. 6, a dielectric structure including first, second, and third portions is formed above the substrate. Specifically, as shown in FIG. 11C, a first dielectric layer 330 and a second dielectric layer 340 are subsequently formed over a front-side 312 of the substrate 310. Subsequently, the second dielectric layer 340 is patterned to form first openings 342 and a second opening 344 in the second dielectric layer 340. The first dielectric layer 330 and the patterned second dielectric layer 340 are referred to as a dielectric structure.

In operation S16 of method M10 of FIG. 6, a gate electrode and a drain electrode are formed above the dielectric structure. For example, a conductive layer is formed over the structure of FIG. 11C, and a patterning process is performed on the conductive layer to form the gate electrode 350 and the drain electrode 360 over the charge-coupled-transistor region 316 as shown in FIG. 11D. In some embodiments, the conductive layer is further patterned to form dummy gate structures 370 over the FET region 318 and respectively over the well regions 324 and 326. In some embodiments, the conductive layer (so as the gate electrode 350, the drain electrode 360, and the dummy gate structures 370) are made of polysilicon. Alternatively, the conductive layer (so as the gate electrode 350, the drain electrode 360, and the dummy gate structures 370) are made of metal-containing material such as aluminum (Al), titanium nitride (TiN), tantalum nitride (TaN), tantalum carbon (TaC), cobalt (Co), ruthenium (Ru), combinations thereof, multi-layers thereof, and the like.

In operation S18 of method M10 of FIG. 6, an interlayer dielectric (ILD) is formed above the gate electrode and the drain electrode. In some embodiments, as shown in FIG. 11E, prior to the formation of the ILD, gate spacers 380 are formed on sidewalls of the dummy gate structures 370. The gate spacers 380 may include a seal spacer and a main spacer (not shown). The gate spacers 380 include one or more dielectric materials, such as silicon oxide, silicon nitride, silicon oxynitride, SiCN, $SiC_xO_yN_z$, or combinations thereof. The seal spacers are formed on sidewalls of the dummy gate structures 370 and the main spacers are formed on the seal spacers. The gate spacers 380 may be formed using a deposition method, such as plasma enhanced chemical vapor deposition (PECVD), low-pressure chemical vapor deposition (LPCVD), sub-atmospheric chemical vapor deposition (SACVD), or the like. The formation of the gate spacers 380 may include blanket forming spacer layers and then performing etching operations to remove the horizontal portions of the spacer layers. The remaining vertical portions of the spacer layers form the gate spacers 380.

Source/drain features 390 are then formed in the well regions 324 and 326 and on opposite sides of the dummy gate structures 370. In some embodiments, the source/drain features 390 are implantation region. In some other embodiments, the source/drain features 390 are epitaxial structures.

A contact etch stop layer (CESL) 410 is conformally formed over the substrate 310 and the dummy gate structures 370. As such, the CESL 410 is in contact with the top surfaces and sidewalls of the dielectric structure 305, the sidewalls of the drain electrode 360 and the gate electrode 350, the gate spacers 380, and the source/drain features 390. In some embodiments, the CESL 410 may be a stressed layer or layers. In some embodiments, the CESL 410 has a tensile stress and is formed of $Si_3N_4$. In some other embodiments, the CESL 410 includes materials such as oxynitrides. In yet some other embodiments, the CESL 410 may have a composite structure including a plurality of layers, such as a silicon nitride layer overlying a silicon oxide layer. The CESL 410 can be formed using plasma enhanced CVD (PECVD), however, other suitable methods, such as low pressure CVD (LPCVD), atomic layer deposition (ALD), and the like, can also be used.

A first ILD 420 is then formed over the substrate 310. The first ILD 420 covers the CESL 410. In some embodiments, the first ILD 420 may be formed by depositing a dielectric material over the CESL 410 and then a planarization process is performed to the dielectric material and the CESL 410 to expose the dummy gate structures. In some embodiments, the deposition process may be chemical vapor deposition (CVD), high-density plasma CVD, spin-on, sputtering, or other suitable methods. In some embodiments, the ILD 420 includes silicon oxide. In some other embodiments, the first ILD 420 may include silicon oxy-nitride, silicon nitride, or a low-k material.

Figure 11F:
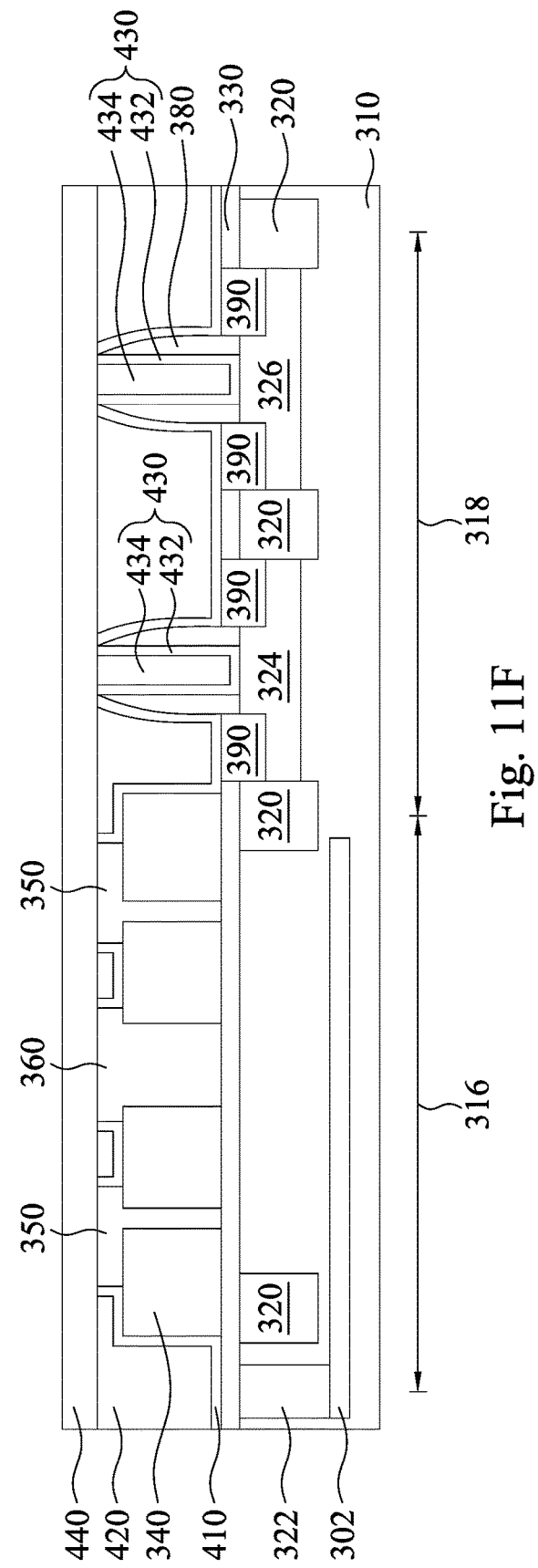

In some embodiments, the dummy gate structures 370 are replaced with metal gate structures 430 as shown in FIG. 11F. A replacement gate (RPG) process scheme is employed. In the RPG process scheme, a dummy polysilicon gate (the dummy gate structures 370 (see FIG. 11E) in this case) is formed in advance and is replaced later by a metal gate structure. In some embodiments, the dummy gate structures 370 are removed to form openings with the gate spacers 380 as their sidewalls. The dummy gate structures 370 may be removed by dry etch, wet etch, or a combination of dry and wet etch.

A gate dielectric layer 432 is conformally formed in the openings. The gate dielectric layer 432 can be a high-κ dielectric layer having a dielectric constant (κ) higher than the dielectric constant of $SiO_2$, i.e. κ>3.9. The gate dielectric layer 432 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The gate dielectric layer 432 is deposited by suitable techniques, such as ALD, CVD, PVD, thermal oxidation, combinations thereof, or other suitable techniques.

At least one metal layer is formed in the openings and on the gate dielectric layer 432. Subsequently, a chemical mechanical planarization (CMP) process is performed to planarize the metal layer and the gate dielectric layer 432 to form the metal gate structures 430 in the openings. The metal gate structure 430 includes the gate dielectric layer 432 and a metal gate electrode 434 over the gate dielectric layer 432. The metal gate electrode 434 may include work function metal layer(s), capping layer(s), fill layer(s), and/or other suitable layers that are desirable in a metal gate stack. The work function metal layer may include n-type and/or p-type work function metal. Exemplary n-type work function metals include Ti, Ag, TaAl, TaAlC, TiAlN, TaC, TaCN, TaSiN, Mn, Zr, other suitable n-type work function materials, or combinations thereof. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. The work function metal layer may have multiple layers. The work function metal layer(s) may be deposited by CVD, PVD, electroplating and/or other suitable process. In some embodiments, the metal gate electrode 434 is a p-type metal gate including a p-type work function metal layer. In some embodiments, the capping layer in the metal gate electrodes 434 may include refractory metals and their nitrides (e.g. TiN, TaN, $W_2N$, TiSiN, TaSiN). The capping layer may be deposited by PVD, CVD, metal-organic chemical vapor deposition (MOCVD) ALD, or the like. In some embodiments, the fill layer in the metal gate electrodes 434 may include tungsten (W). The fill layer may be deposited by ALD, PVD, CVD, or other suitable process.

Figure 11G:
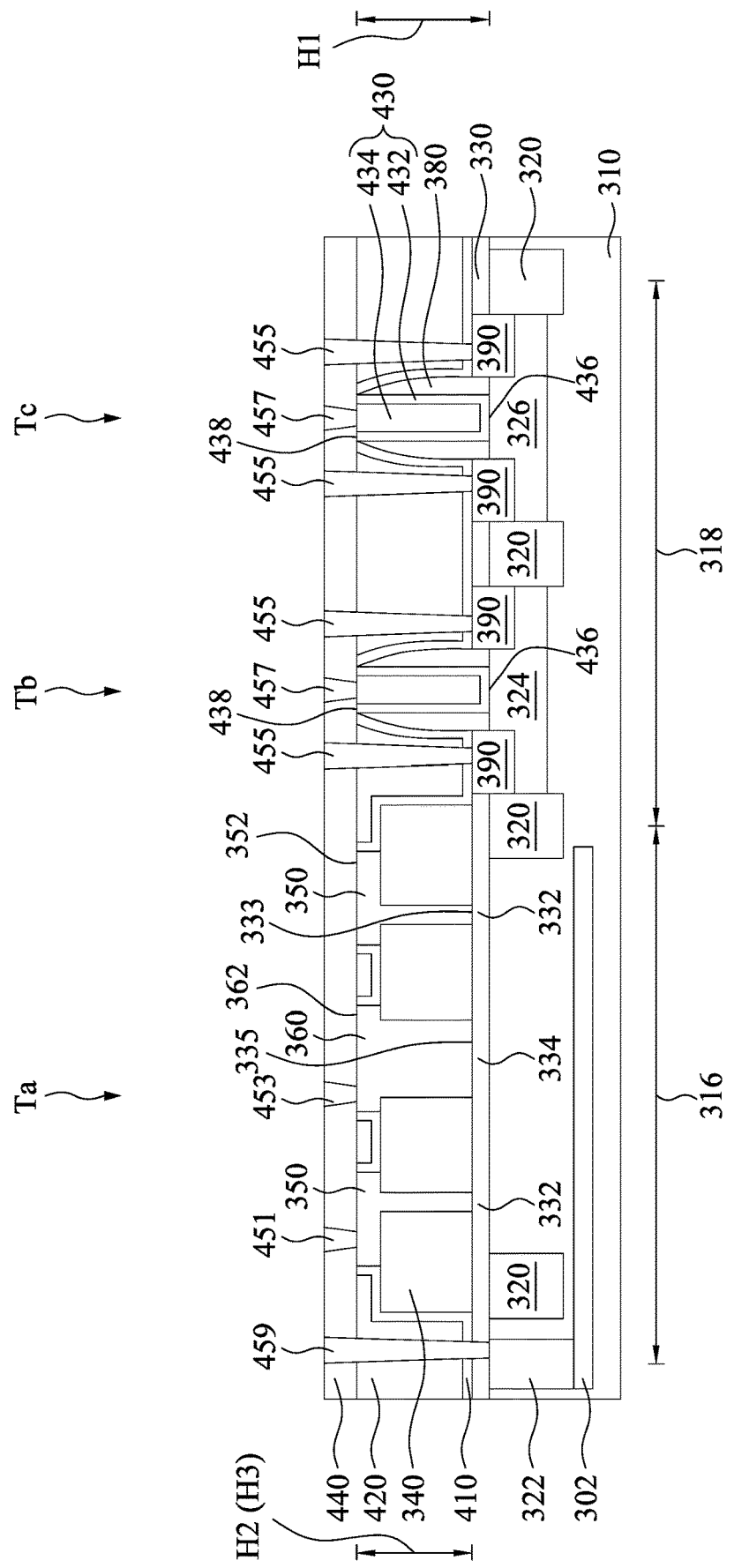

In FIG. 11G, the implantation region 302, the dielectric structure 305, the gate electrode 350, and the drain electrode 360 are referred to as a charge-coupled transistor Ta; the well region 324, the source/drain features 390 in the well region 324, and the gate structure 430 above the well region 324 are referred to as a P-type FET Tb; and the well region 326, the source/drain features 390 in the well region 326, and the gate structure 430 above the well region 326 are referred to as an N-type FET Tc. A portion of the well region 324 between the source/drain features 390 are referred to as a channel portion of the P-type FET Tb, and a portion of the well region 326 between the source/drain features 390 are referred to as a channel portion of the N-type FET Tc. Bottom surfaces 436 of the gate structures 430 are lower than a top surface 333 of the first portion 332 of the dielectric structure 305 and lower than a top surface 335 of the second portion 334 of the dielectric structure 305. In some embodiments, top surfaces 438 of the gate structures 430, the top surface 362 of the drain electrode 360, and the top surface 352 of the gate electrode 350 are substantially coplanar. In some embodiments, a height H1 of the gate structure 430 is greater than a height H2 of the gate electrode 350 and is greater than a height H3 of the drain electrode 360.

A second ILD 440 is formed over the first ILD 420 and the metal gate structures 430. The second ILD 440 is similar to or substantially the same as the first ILD 420, and, therefore, a description thereof is not repeated herein.

In operation S20 of method M10 of FIG. 6, contacts are formed in the ILD. In FIG. 11G, contacts 451, 453, 455, 457, and 459 are formed in the second ILD 440 (and in the first ILD 420). The contact 451 is electrically connected to the gate electrode 350, the contact 453 is electrically connected to the drain electrode 360, the contacts 455 are respectively and electrically connected to the source/drain features 390, the contacts 457 are respectively and electrically connected to the metal gate structures 430, and the contact 459 is electrically connected to the implantation region 302 through the well region 322.

Figure 12:
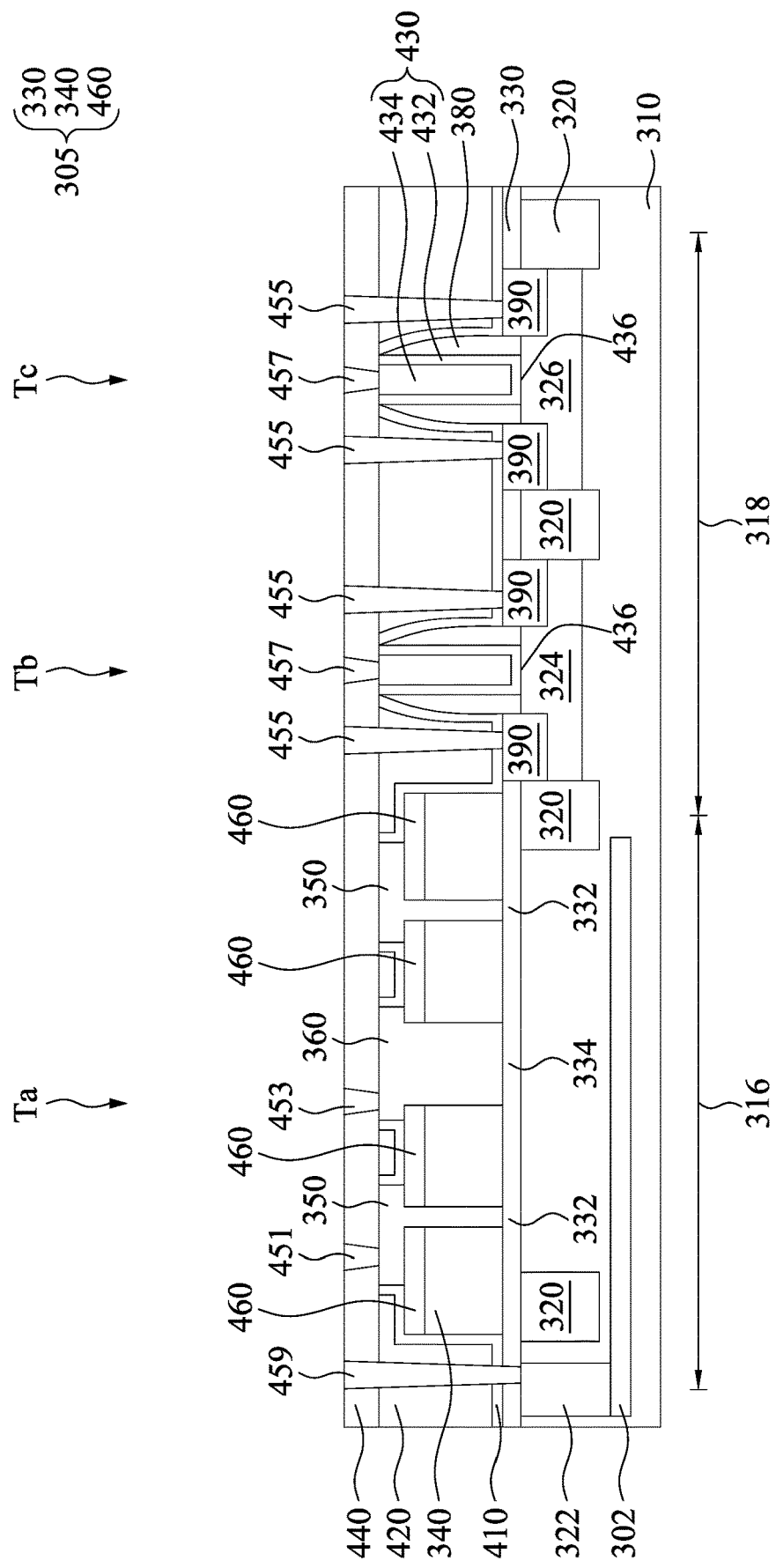
FIG. 12 illustrates a semiconductor device in accordance with some embodiments.

FIG. 12 illustrates a semiconductor device in accordance with some embodiments. In some embodiments, a high-k dielectric layer 460 is formed over the second dielectric layer 340 prior to forming the gate electrode 350 and the drain electrode 360. As such, the first dielectric layer 330, the second dielectric layer 340, and the high-k dielectric layer 460 are referred to as the dielectric structure 305. The high-k dielectric layer 460 is similar to or substantially the same as the high-k dielectric layer 128, and, therefore, a description in this regard will not be repeated hereinafter.

Figure 13B:
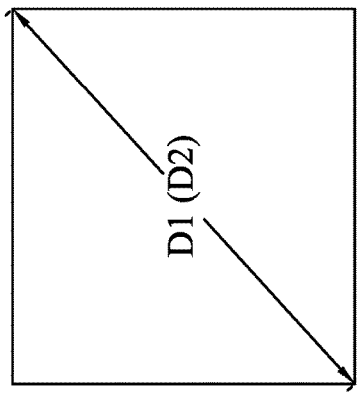
FIGS. 13A to 13D are top views of the first portion or the second portion of FIG. 1A, in accordance with some embodiments.
Figure 13D:
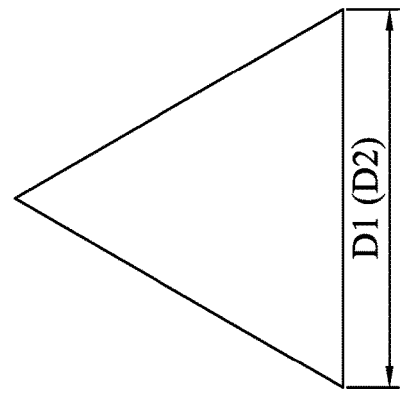
Figure 13A:
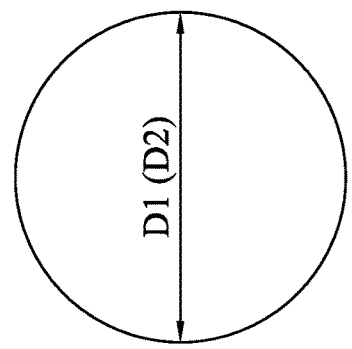
Figure 13C:
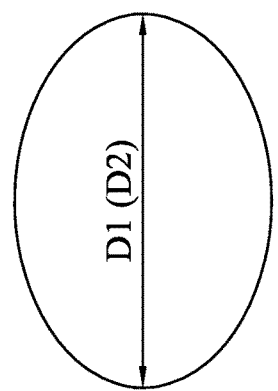

FIGS. 13A to 13D are top views of the first portion 122 or the second portion 124 of FIG. 1A, in accordance with some embodiments. Each of the first portions 122 and the second portion 124 can be in arbitrary shapes. For example, as shown in FIG. 13A, each of the first portions 122 and the second portion 124 is a circle with a maximum diameter/width D1 (or D2). As shown in FIG. 13B, each of the first portions 122 and the second portion 124 is a square/rectangle with a maximum diameter/width D1 (or D2). As shown in FIG. 13C, each of the first portions 122 and the second portion 124 is an ellipse with a maximum diameter/width D1 (or D2). As shown in FIG. 13A, each of the first portions 122 and the second portion 124 is a triangle with a maximum diameter/width D1 (or D2).

Figure 14:
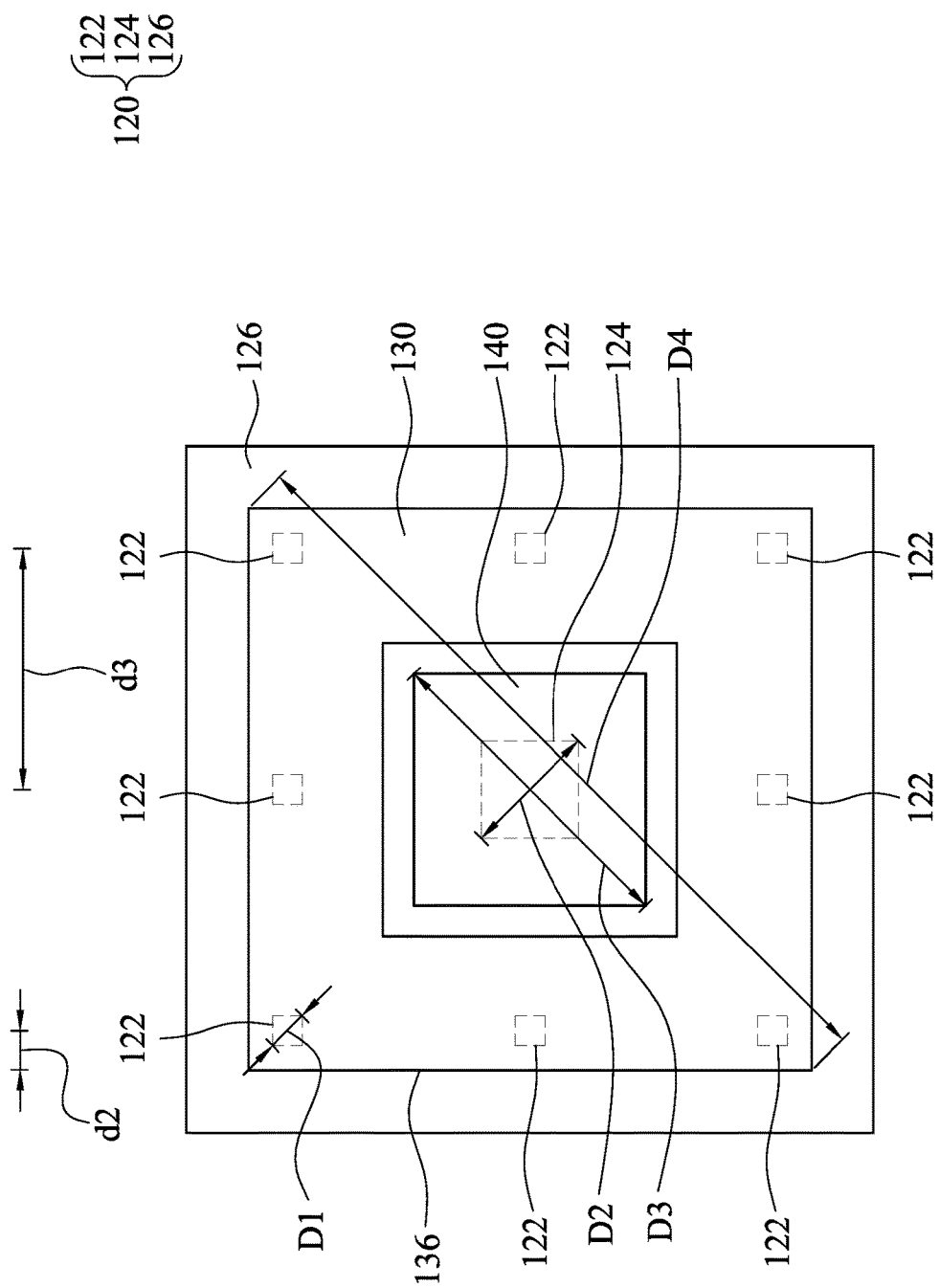
FIG. 14 is a top view of a semiconductor device, in accordance with some embodiments.

FIG. 14 is a top view of a semiconductor device, in accordance with some embodiments. The difference between the semiconductor devices in FIGS. 14 and 1A pertains to the shapes of the gate electrode 130, the drain electrode 140, the first portions 122, and the second portion 124 of the dielectric structure 120. In FIG. 14, all of the gate electrode 130, the drain electrode 140, the first portions 122, and the second portion 124 are squares in the top view. Each of the first portions 122 has a (maximum) width D1, the second portion 124 has a (maximum) width D2, the drain electrode 140 has a (maximum) width D3, the gate electrode 130 has a (maximum) width D4, a distance d2 is between the outer sidewall 138 of the gate electrode 130 and the centroid of each of the first portions 122, and a (minimum) distance d3 is between adjacent two first portions 122. Since the dimensions of the widths D1-D4 and the distances d2 and d3 are similar to or substantially the same as the widths/diameters D1-D4 and the distances d2 and d3 in FIGS. 1A-1B, a description in this regard will not be repeated hereinafter. Further, other relevant structural details of the semiconductor device in FIG. 14 are substantially the same as or similar to the semiconductor devices in FIGS. 1A and 1B, and, therefore, a description in this regard will not be repeated hereinafter.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the first portions of the dielectric structure improve SS of the semiconductor device. Another advantage is that the second portion of the dielectric structure improves the turn-on drain current of the semiconductor device. Further, the formations of the first portions and/or the second portions are compatible with the formation of CMOS (e.g., N-type and P-type FETs).

According to some embodiments, a device includes a substrate, a dielectric structure, a gate electrode, and a drain electrode. The dielectric structure is over the substrate. The dielectric structure includes a first portion, a second portion, and a third portion. The first portion has a first equivalent oxide thickness. The second portion is spaced apart from the first portion and has a second equivalent oxide thickness. The third portion laterally surrounds the first and second portions and has a third equivalent oxide thickness greater than the first equivalent oxide thickness of the first portion. The gate electrode is over the dielectric structure and in contact with the first and third portions of the dielectric structure. The drain electrode is over the dielectric structure and in contact with the second and third portions of the dielectric structure.

According to some embodiments, a device includes a substrate, a first transistor, and a second transistor. The first transistor is over the substrate and includes a dielectric structure, a drain electrode, and a gate electrode. The dielectric structure includes a first portion and a second portion thicker than the first portion. The drain electrode is over the second portion of the dielectric structure and is spaced apart from the first portion of the dielectric structure. The gate electrode is over and in contact with the first and second portions of the dielectric structure. The second transistor is over the substrate and includes a channel portion, a source/drain feature, and a gate structure. The channel portion is in the substrate. The source/drain feature is adjacent to the channel portion. The gate structure is over the channel portion. A bottom surface of the gate structure is lower than a top surface of the first portion of the dielectric structure of the first transistor.

According to some embodiments, a method includes forming a dielectric structure over a substrate. The dielectric structure includes a first portion and a second portion thicker than the first portion. A drain electrode is formed over the substrate and in contact with the first portion and the second portion of the dielectric structure. A gate electrode is formed over the dielectric structure, in contact with the second portion of the dielectric structure, and spaced apart from the first portion of the dielectric structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a substrate;
   a dielectric structure over the substrate and comprising:
   a plurality of first portions each having a first equivalent oxide thickness, wherein from a top view, the first portions of the dielectric structure are first circular patterns discontinuous from each other;
   a second portion spaced apart from the first portions and having a second equivalent oxide thickness,
   wherein from the top view, the second portion of the dielectric structure has a second circular pattern, and the first circular patterns of the first portions encircle the second circular pattern of the second portion in a ring-like path; and
   a third portion laterally surrounding the first and second portions and having a third equivalent oxide thickness greater than the first equivalent oxide thickness of the first portions, wherein a top surface of the third portion of the dielectric structure is at a position higher than top surfaces of the first and second portions of the dielectric structure relative to the substrate, wherein from the top view, the first portions of the dielectric structure are individually encircled and isolated by the third portion of the dielectric structure;
   a gate electrode over the dielectric structure and in contact with the first and third portions of the dielectric structure; and
   a drain electrode over the dielectric structure and in contact with the second and third portions of the dielectric structure, wherein a bottommost surface of the drain electrode is in direct contact with the top surface of the second portion of the dielectric structure.

2. The device of claim 1, wherein the gate electrode laterally surrounds the drain electrode.

3. The device of claim 1, wherein the first portions of the dielectric structure is spaced apart from the drain electrode.

4. The device of claim 1, wherein the second portion of the dielectric structure is spaced apart from the gate electrode.

5. The device of claim 1, further comprising a source electrode, and the substrate is between the source electrode and the dielectric structure, and from a cross-sectional view, the gate electrode vertically overlaps the source electrode.

6. The device of claim 1, wherein a diameter of the second circular pattern of the second portion of the dielectric structure is greater than a diameter of each of the first circular patterns of the first portions of the dielectric structure.

7. The device of claim 1, wherein from a cross-sectional view, the drain electrode has a stepped sidewall structure having an upper sidewall, a lower sidewall horizontally set back from the upper sidewall, a first horizontal surface connecting the lower sidewall to the upper sidewall, and a second horizontal surface connecting the lower sidewall at a side of the lower sidewall opposing the first horizontal surface, and the second horizontal surface is the bottommost surface of the drain electrode.

8. A device comprising:
   a substrate;
   a first transistor over the substrate and comprising:
   a dielectric structure comprising a first portion and a second portion over the first portion and having a thicker thickness than the first portion, wherein the first portion of the dielectric structure laterally extends across opposite sidewalls of the second portion of the dielectric structure, and the first portion of the dielectric structure is in contact with an entirety of a bottom surface of the second portion of the dielectric structure;
   a drain electrode penetrating through the second portion of the dielectric structure, wherein a bottommost surface of the drain electrode is in direct contact with a top surface of the first portion of the dielectric structure; and
   a gate electrode having a first T-shaped pattern from a cross-sectional view, the first T-shaped pattern having a horizontal linear portion above a topmost position of the dielectric structure and a vertical linear portion penetrating through the second portion of the dielectric structure and being in contact with the top surface of the first portion of the dielectric structure; and
   a second transistor over the substrate and comprising:
   a channel portion in the substrate;
   a source/drain feature adjacent to the channel portion; and a gate structure over the channel portion, wherein a bottom surface of the gate structure is lower than the top surface of the first portion of the dielectric structure of the first transistor.

9. The device of claim 8, wherein the dielectric structure of the first transistor further comprising a high-k dielectric layer between the horizontal linear portion of the gate electrode and the second portion of the dielectric structure.

10. The device of claim 8, wherein the first portion of the dielectric structure laterally extends across opposite sidewalls of the drain electrode.

11. The device of claim 8, wherein the drain electrode having a second T-shaped pattern from the cross-sectional view, the second T-shaped pattern having a horizontal linear portion above the topmost position of the dielectric structure and a vertical linear portion.

12. The device of claim 11, wherein the gate electrode having a third T-shaped pattern from the cross-sectional view, and the second T-shaped pattern of the drain electrode is laterally between the first and third T-shaped patterns of the gate electrode.

13. The device of claim 8, wherein a bottommost surface of the gate electrode in direct contact with a topmost surface of the first portion of the dielectric structure.

14. A method, comprising:
forming a dielectric structure over a substrate, wherein the dielectric structure comprises a first portion, a second portion, and a third portion laterally surrounding the first and second portions and having a thicker thickness than the first and second portions;
forming a drain electrode over the substrate, wherein from a cross-sectional view, the drain electrode has a stepped sidewall structure having an upper sidewall, a lower sidewall horizontally set back from the upper sidewall, a first horizontal surface connecting the lower sidewall to the upper sidewall, and a second horizontal surface connecting the lower sidewall at a side of the lower sidewall opposing the first horizontal surface, the second horizontal surface is a bottommost surface of the drain electrode in direct contact with a top surface of the first portion of the dielectric structure, and the first horizontal surface is in contact with a top surface of the third portion of the dielectric structure, and from a top view, the drain electrode and the first portion of the dielectric structure are concentric circles; and forming a gate electrode over the dielectric structure, in contact with the second portion of the dielectric structure, and spaced apart from the first portion of the dielectric structure.

15. The method of claim 14, wherein forming the dielectric structure comprises:
forming a first dielectric layer comprising the first and second portions over the substrate;
forming a second dielectric layer over the first dielectric layer; and
patterning the second dielectric layer to form a first opening exposing the first portion of the first dielectric layer and a second opening exposing the second portion of the first dielectric layer.

16. The method of claim 14, wherein forming the dielectric structure comprises:
forming a first dielectric layer over the substrate;
patterning the first dielectric layer to form first and second openings in the first dielectric layer, wherein a remaining portion of the first dielectric layer is the third portion of the dielectric structure; and
forming the first portion of the dielectric structure in the first opening and the second portion of the dielectric structure in the second opening.

17. The method of claim 14, wherein the gate electrode is in contact with a top surface of the second portion and the top surface of the third portion of the dielectric structure.

18. The method of claim 14, wherein from the cross-sectional view, the gate electrode has a stepped sidewall structure having an upper sidewall, a lower sidewall horizontally set back from the upper sidewall, a first horizontal surface connecting the lower sidewall to the upper sidewall, and a second horizontal surface connecting the lower sidewall at a side of the lower sidewall opposing the first horizontal surface.

19. The method of claim 14, wherein the gate electrode comprises a ring-shaped portion positioned above the dielectric structure, with a plurality of protruding portions extending downward from the ring-shaped portion, passing through the third portion of the dielectric structure and reaching the second portion of the dielectric structure.

20. The method of claim 14, wherein from the top view, the second portion of the dielectric structure comprises a plurality of distinct regions, each forming separate circular patterns that are not connected to one another, and the distinct regions of the second portion are each encircled and isolated by the third portion of the dielectric structure.

* * * * *